(12) United States Patent
Mayer et al.

(10) Patent No.: US 9,074,286 B2
(45) Date of Patent: Jul. 7, 2015

(54) WET ETCHING METHODS FOR COPPER REMOVAL AND PLANARIZATION IN SEMICONDUCTOR PROCESSING

(71) Applicant: Novellus Systems, Inc., Fremont, CA (US)

(72) Inventors: Steven T. Mayer, Aurora, OR (US); Eric Webb, Camas, WA (US); David W. Porter, Sherwood, OR (US)

(73) Assignee: Novellus Systems, Inc., Fremont, CA (US)

( * ) Notice: Subject to any disclaimer, the term of this patent is extended or adjusted under 35 U.S.C. 154(b) by 17 days.

(21) Appl. No.: 13/725,308

(22) Filed: Dec. 21, 2012

(65) Prior Publication Data

US 2013/0207030 A1    Aug. 15, 2013

Related U.S. Application Data

(63) Continuation of application No. 12/535,594, filed on Aug. 4, 2009, now Pat. No. 8,372,757, which is a continuation-in-part of application No. 11/888,312, filed on Jul. 30, 2007, now Pat. No. 7,972,970, which (Continued)

(51) Int. Cl.
*C09K 13/06* (2006.01)
*C23F 1/34* (2006.01)

(Continued)

(52) U.S. Cl.
CPC ... *C23F 1/34* (2013.01); *C23F 1/02* (2013.01); *C23F 3/04* (2013.01); *C25D 5/48* (2013.01);

(Continued)

(58) Field of Classification Search
CPC ............... C23F 1/18; C23F 1/44; C23F 1/34; C23F 1/30; C23F 1/42; C23F 1/00

USPC .............. 252/79.1, 79.2, 79.3, 79.4, 79.5; 438/745, 750
See application file for complete search history.

(56) References Cited

U.S. PATENT DOCUMENTS

| 4,002,778 A | 1/1977 | Bellis et al. |
| 4,051,001 A | 9/1977 | Inoue et al. |

(Continued)

FOREIGN PATENT DOCUMENTS

| CN | 1278564 A | 1/2001 |
| CN | 1607268 A | 4/2005 |

(Continued)

OTHER PUBLICATIONS

U.S. Appl. No. 10/742,006, filed Nov. 20, 2006.

(Continued)

*Primary Examiner* — Lan Vinh
(74) *Attorney, Agent, or Firm* — Weaver Austin Villeneuve & Sampson LLP

(57) ABSTRACT

Exposed copper regions on a semiconductor substrate can be etched by a wet etching solution comprising (i) one or more complexing agents selected from the group consisting of bidentate, tridentate, and quadridentate complexing agents; and (ii) an oxidizer, at a pH of between about 5 and 12. In many embodiments, the etching is substantially isotropic and occurs without visible formation of insoluble species on the surface of copper. The etching is useful in a number of processes in semiconductor fabrication, including for partial or complete removal of copper overburden, for planarization of copper surfaces, and for forming recesses in copper-filled damascene features. Examples of suitable etching solutions include solutions comprising a diamine (e.g., ethylenediamine) and/or a triamine (e.g., diethylenetriamine) as bidentate and tridentate complexing agents respectively and hydrogen peroxide as an oxidizer. In some embodiments, the etching solutions further include pH adjustors, such as sulfuric acid, aminoacids, and carboxylic acids.

13 Claims, 19 Drawing Sheets

Related U.S. Application Data is a continuation-in-part of application No. 11/586,394, filed on Oct. 24, 2006, now Pat. No. 7,531,463, which is a continuation-in-part of application No. 10/690,084, filed on Oct. 20, 2003, now Pat. No. 7,338,908, said application No. 12/535,594 is a continuation-in-part of application No. 11/602,128, filed on Nov. 20, 2006, now Pat. No. 8,158,532, and a continuation-in-part of application No. 11/544,957, filed on Oct. 5, 2006, now Pat. No. 7,799,200, said application No. 11/602,128 is a continuation-in-part of application No. 10/824,069, filed on Apr. 13, 2004, now Pat. No. 7,405,163, and a continuation-in-part of application No. 10/739,822, filed on Dec. 17, 2003, now Pat. No. 7,449,098, and a continuation-in-part of application No. 10/690,084, filed on Oct. 20, 2003, now Pat. No. 7,338,908, and a continuation-in-part of application No. 10/693,223, filed on Oct. 24, 2003, now Pat. No. 7,189,647.

(60) Provisional application No. 60/737,978, filed on Nov. 19, 2005, provisional application No. 60/724,209, filed on Oct. 5, 2005.

(51) Int. Cl.

| | |
|---|---|
| *C23F 1/02* | (2006.01) |
| *C23F 3/04* | (2006.01) |
| *C25D 5/48* | (2006.01) |
| *H01L 21/02* | (2006.01) |
| *H01L 21/288* | (2006.01) |
| *H01L 21/321* | (2006.01) |
| *H01L 21/3213* | (2006.01) |
| *H01L 21/67* | (2006.01) |
| *H01L 21/768* | (2006.01) |
| *H01L 23/532* | (2006.01) |
| *C25D 7/12* | (2006.01) |
| *C25D 17/00* | (2006.01) |

(52) U.S. Cl.
CPC ........ *H01L 21/02074* (2013.01); *H01L 21/288* (2013.01); *H01L 21/32115* (2013.01); *H01L 21/32134* (2013.01); *H01L 21/67051* (2013.01); *H01L 21/6708* (2013.01); *H01L 21/76849* (2013.01); *H01L 21/76856* (2013.01); *H01L 21/76858* (2013.01); *H01L 21/76883* (2013.01); *H01L 21/76898* (2013.01); *H01L 23/53238* (2013.01); *C25D 7/123* (2013.01); *C25D 17/001* (2013.01); *H01L 2924/0002* (2013.01)

(56) References Cited

U.S. PATENT DOCUMENTS

| | | |
|---|---|---|
| 4,181,760 A | 1/1980 | Feldstein |
| 4,311,551 A | 1/1982 | Sykes |
| 4,378,270 A | 3/1983 | Brasch |
| 4,737,446 A | 4/1988 | Cohen et al. |
| 4,981,725 A | 1/1991 | Nuzzi et al. |
| 5,151,168 A | 9/1992 | Gilton et al. |
| 5,318,803 A | 6/1994 | Bickford et al. |
| 5,380,560 A | 1/1995 | Kaja et al. |
| 5,382,447 A | 1/1995 | Kaja et al. |
| 5,486,234 A | 1/1996 | Contolini et al. |
| 5,576,052 A | 11/1996 | Arledge et al. |
| 5,674,787 A | 10/1997 | Zhao et al. |
| 5,695,810 A | 12/1997 | Dubin et al. |
| 5,770,095 A | 6/1998 | Sasaki et al. |
| 5,824,599 A | 10/1998 | Schacham-Diamand et al. |
| 5,891,513 A | 4/1999 | Dubin et al. |
| 5,897,375 A | 4/1999 | Watts et al. |
| 5,913,147 A | 6/1999 | Dubin et al. |
| 5,969,422 A | 10/1999 | Ting et al. |
| 5,972,192 A | 10/1999 | Dubin et al. |
| 6,065,424 A | 5/2000 | Shacham-Diamond et al. |
| 6,136,707 A | 10/2000 | Cohen |
| 6,139,763 A | 10/2000 | Ina et al. |
| 6,174,353 B1 | 1/2001 | Yuan et al. |
| 6,181,013 B1 | 1/2001 | Liu et al. |
| 6,184,124 B1 | 2/2001 | Hasegawa et al. |
| 6,197,181 B1 | 3/2001 | Chen |
| 6,197,364 B1 | 3/2001 | Paunovic et al. |
| 6,214,696 B1 | 4/2001 | Wu |
| 6,270,619 B1 | 8/2001 | Suzuki et al. |
| 6,293,850 B1 | 9/2001 | Lin et al. |
| 6,309,981 B1 | 10/2001 | Mayer et al. |
| 6,329,284 B2 | 12/2001 | Maekawa |
| 6,342,733 B1 | 1/2002 | Hu et al. |
| 6,355,153 B1 | 3/2002 | Uzoh et al. |
| 6,391,188 B1 | 5/2002 | Goosey |
| 6,394,114 B1 | 5/2002 | Gupta et al. |
| 6,398,855 B1 | 6/2002 | Palmans et al. |
| 6,426,012 B1 * | 7/2002 | O'Sullivan et al. ............. 216/22 |
| 6,524,167 B1 | 2/2003 | Tsai et al. |
| 6,537,416 B1 | 3/2003 | Mayer et al. |
| 6,586,342 B1 | 7/2003 | Mayer et al. |
| 6,645,567 B2 | 11/2003 | Chebiam et al. |
| 6,664,122 B1 | 12/2003 | Andryuschenko et al. |
| 6,692,546 B2 | 2/2004 | Ma et al. |
| 6,692,873 B1 | 2/2004 | Park et al. |
| 6,709,563 B2 | 3/2004 | Nagai et al. |
| 6,713,122 B1 | 3/2004 | Mayer et al. |
| 6,716,753 B1 | 4/2004 | Shue et al. |
| 6,774,041 B1 | 8/2004 | Kondo et al. |
| 6,775,907 B1 | 8/2004 | Boyko et al. |
| 6,815,349 B1 | 11/2004 | Minshall et al. |
| 6,884,724 B2 | 4/2005 | Hsu et al. |
| 6,887,776 B2 | 5/2005 | Shang et al. |
| 6,946,065 B1 | 9/2005 | Mayer et al. |
| 6,962,873 B1 | 11/2005 | Park |
| 6,975,032 B2 | 12/2005 | Chen et al. |
| 6,984,166 B2 | 1/2006 | Maury et al. |
| 7,001,843 B2 | 2/2006 | Park |
| 7,001,854 B1 | 2/2006 | Papasouliotis et al. |
| 7,008,871 B2 | 3/2006 | Andricacos et al. |
| 7,037,854 B2 | 5/2006 | Bachrach et al. |
| 7,049,234 B2 | 5/2006 | Cheng et al. |
| 7,056,648 B2 | 6/2006 | Cooper et al. |
| 7,097,538 B2 | 8/2006 | Talieh et al. |
| 7,124,386 B2 | 10/2006 | Smith et al. |
| 7,217,649 B2 | 5/2007 | Bailey, III et al. |
| 7,262,504 B2 | 8/2007 | Cheng et al. |
| 7,285,494 B2 | 10/2007 | Cheng et al. |
| 7,338,908 B1 | 3/2008 | Koos et al. |
| 7,405,163 B1 | 7/2008 | Drewery et al. |
| 7,449,098 B1 | 11/2008 | Mayer et al. |
| 7,491,252 B2 | 2/2009 | Bian |
| 7,531,463 B2 | 5/2009 | Koos et al. |
| 7,537,709 B2 | 5/2009 | Cooper et al. |
| 7,605,082 B1 | 10/2009 | Reid et al. |
| 7,686,935 B2 | 3/2010 | Mayer et al. |
| 7,811,925 B1 | 10/2010 | Reid et al. |
| 7,897,198 B1 | 3/2011 | Park et al. |
| 7,972,970 B2 | 7/2011 | Mayer et al. |
| 8,043,958 B1 | 10/2011 | Reid et al. |
| 8,158,532 B2 | 4/2012 | Mayer et al. |
| 8,372,757 B2 | 2/2013 | Mayer et al. |
| 8,415,261 B2 | 4/2013 | Reid et al. |
| 8,470,191 B2 | 6/2013 | Mayer et al. |
| 8,481,432 B2 | 7/2013 | Mayer et al. |
| 8,530,359 B2 | 9/2013 | Mayer et al. |
| 8,597,461 B2 | 12/2013 | Mayer et al. |
| 2001/0006224 A1 | 7/2001 | Tsuchiya et al. |
| 2001/0034125 A1 | 10/2001 | Uozumi |
| 2001/0038448 A1 | 11/2001 | Jun et al. |
| 2002/0027081 A1 | 3/2002 | Nagai et al. |
| 2002/0061635 A1 | 5/2002 | Lee et al. |
| 2002/0066673 A1 | 6/2002 | Rodbell et al. |
| 2002/0084529 A1 | 7/2002 | Dubin et al. |
| 2002/0092827 A1 | 7/2002 | Sun et al. |

(56) References Cited

U.S. PATENT DOCUMENTS

| | | | |
|---|---|---|---|
| 2002/0108861 A1 | 8/2002 | Emesh et al. | |
| 2003/0001271 A1 | 1/2003 | Uozumi | |
| 2003/0003711 A1 | 1/2003 | Modak | |
| 2003/0057526 A1 | 3/2003 | Chung et al. | |
| 2003/0059538 A1 | 3/2003 | Chung et al. | |
| 2003/0075808 A1 | 4/2003 | Inoue et al. | |
| 2003/0079526 A1 | 5/2003 | Hayward et al. | |
| 2003/0083214 A1* | 5/2003 | Kakizawa et al. | 510/175 |
| 2003/0111354 A1 | 6/2003 | Hara et al. | |
| 2003/0166382 A1 | 9/2003 | Ashjaee et al. | |
| 2003/0176049 A1 | 9/2003 | Hegde et al. | |
| 2003/0190426 A1 | 10/2003 | Padhi et al. | |
| 2003/0194878 A1 | 10/2003 | Miya | |
| 2003/0203616 A1 | 10/2003 | Chung et al. | |
| 2004/0020520 A1 | 2/2004 | Kim et al. | |
| 2004/0040853 A1 | 3/2004 | Marsh et al. | |
| 2004/0065540 A1 | 4/2004 | Mayer et al. | |
| 2004/0108302 A1 | 6/2004 | Liu et al. | |
| 2004/0226827 A1 | 11/2004 | Matsuda et al. | |
| 2004/0253740 A1 | 12/2004 | Shalyt et al. | |
| 2005/0000940 A1 | 1/2005 | Iwamoto et al. | |
| 2005/0074967 A1 | 4/2005 | Kondo et al. | |
| 2005/0158985 A1 | 7/2005 | Chen et al. | |
| 2005/0178503 A1 | 8/2005 | Okamoto | |
| 2005/0250339 A1 | 11/2005 | Shea et al. | |
| 2005/0266265 A1 | 12/2005 | Cheng et al. | |
| 2006/0037855 A1 | 2/2006 | Hanson et al. | |
| 2006/0205204 A1 | 9/2006 | Beck | |
| 2007/0105377 A1 | 5/2007 | Koos et al. | |
| 2007/0131561 A1 | 6/2007 | Wang et al. | |
| 2008/0286701 A1 | 11/2008 | Rath et al. | |
| 2009/0014415 A1 | 1/2009 | Chelle et al. | |
| 2009/0120457 A1 | 5/2009 | Naghshineh et al. | |
| 2009/0277867 A1 | 11/2009 | Mayer et al. | |
| 2009/0280649 A1 | 11/2009 | Mayer et al. | |
| 2009/0283499 A1 | 11/2009 | Mayer et al. | |
| 2010/0015805 A1 | 1/2010 | Mayer et al. | |
| 2010/0029088 A1 | 2/2010 | Mayer et al. | |
| 2011/0056913 A1 | 3/2011 | Mayer et al. | |
| 2011/0223772 A1 | 9/2011 | Mayer et al. | |
| 2014/0061158 A1 | 3/2014 | Mayer et al. | |

FOREIGN PATENT DOCUMENTS

| | | |
|---|---|---|
| CN | 1802456 A | 7/2006 |
| CN | 101195917 | 6/2008 |
| GB | 1 400 510 | 7/1975 |
| JP | 2111883 | 4/1990 |
| JP | 03-122266 A | 5/1991 |
| JP | 2001-110759 A | 4/2001 |
| JP | 2005-005341 | 1/2005 |
| JP | 2005-187865 | 7/2005 |
| JP | 2005-260213 A | 9/2005 |
| JP | 2009-160486 | 7/2009 |
| JP | 2010-232486 | 10/2010 |
| KR | 10-2009-0069606 | 7/2009 |
| KR | 10-0939534 B | 7/2009 |
| WO | WO 99/47731 | 9/1999 |
| WO | WO 03/098676 | 11/2003 |
| WO | WO 2009/023387 | 2/2009 |
| WO | WO 2011/028667 | 3/2011 |

OTHER PUBLICATIONS

TW Decision of the IPO dated Aug. 29, 2013 issued in TW 098125712.
CN Office Action dated Apr. 1, 2014 issued in CN201080039039.4.
CN Office Action dated Nov. 4, 2013 issued in CN200910164003.8.
CN Office Action dated Mar. 4, 2014 issued in 201080034653.1.
JP Office Action dated Apr. 22, 2014 issued in JP 2009-207571.
Ling, Mo et al., "Study of Influencing factors of Alkaline Etching Solution," Surface Technology, vol. 38, No. 1, Feb. 2009, pp. 54-56 (English abstract only).

US Office Action dated Dec. 24, 2003 issued in U.S. Appl. No. 10/317,373.
US Final Office Action dated May 27, 2004 issued in U.S. Appl. No. 10/317,373.
US Office Action dated Aug. 20, 2004 issued in U.S. Appl. No. 10/317,373.
US Final Office Action dated Dec. 23, 2004 issued in U.S. Appl. No. 10/317,373.
US Notice of Allowance dated May 4, 2005 issued in U.S. Appl. No. 10/317,373.
US Office Action dated Jul. 15, 2005 issued in U.S. Appl. No. 10/742,006.
US Final Office Action dated Mar. 29, 2006 issued in U.S. Appl. No. 10/742,006.
US Office Action dated Aug. 16, 2006 issued in U.S. Appl. No. 10/742,006.
US Office Action dated Aug. 5, 2005 issued in U.S. Appl. No. 10/690,084.
US Office Action dated Feb. 14, 2006 issued in U.S. Appl. No. 10/690,084.
US Final Office Action dated Jul. 25, 2006 issued in U.S. Appl. No. 10/690,084.
US Office Action dated Nov. 30, 2006 issued in U.S. Appl. No. 10/690,084.
US Notice of Allowance dated Mar. 2, 2007 issued in U.S. Appl. No. 10/690,084.
US Office Action dated Aug. 2, 2007 issued in U.S. Appl. No. 10/690,084.
US Notice of Allowance dated Oct. 2, 2007 issued in U.S. Appl. No. 10/690,084.
US Office Action dated Jul. 27, 2007 issued in U.S. Appl. No. 11/586,394.
US Office Action dated Nov. 26, 2007 issued in U.S. Appl. No. 11/586,394.
US Final Office Action dated Jun. 12, 2008 issued in U.S. Appl. No. 11/586,394.
US Office Action dated Dec. 4, 2008 issued in U.S. Appl. No. 11/586,394.
US Notice of Allowance dated Mar. 13, 2009 issued in U.S. Appl. No. 11/586,394.
U.S. Office Action dated Aug. 10, 2010 issued in U.S. Appl. No. 11/888,312.
US Notice of Allowance dated May 19, 2011 issued in U.S. Appl. No. 11/888,312.
US Office Action dated Aug. 10, 2010 issued in U.S. Appl. No. 13/116,963.
US Office Action dated Aug. 3, 2012 issued in in U.S. Appl. No. 13/116,963.
US Notice of Allowance dated Mar. 14, 2013 issued in in U.S. Appl. No. 13/116,963.
U.S. Office Action dated Mar. 9, 2012 issued in U.S. Appl. No. 12/535,594.
US Notice of Allowance dated Oct. 1, 2012 issued in U.S. Appl. No. 12/535,594.
US Office Action dated Jan. 23, 2007 issued in U.S. Appl. No. 11/251,353.
US Final Office Action dated Jul. 18, 2007 issued in U.S. Appl. No. 11/251,353.
US Office Action dated Feb. 8, 2008 issued in U.S. Appl. No. 11/251,353.
US Notice of Allowance dated May 13, 2008 issued in U.S. Appl. No. 11/251,353.
US Notice of Allowance dated Jun. 11, 2010 issued in U.S. Appl. No. 12/184,145.
US Notice of Allowance dated Jul. 12, 2011 issued in U.S. Appl. No. 12/875,857.
US Notice of Allowance dated Nov. 26, 2012 issued in U.S. Appl. No. 13/270,809.
US Office Action dated Jan. 8, 2013 issued in U.S. Appl. No. 12/871,662.
US Notice of Allowance dated Jul. 31, 2013 issued in U.S. Appl. No. 12/871,662.

(56) References Cited

OTHER PUBLICATIONS

US Office Action dated Oct. 20, 2010 issued in U.S. Appl. No. 11/602,128.
US Notice of Allowance dated May 11, 2011 issued in U.S. Appl. No. 11/602,128.
US Notice of Allowance dated Dec. 16, 2011 issued in U.S. Appl. No. 11/602,128.
US Office Action dated Jun. 22, 2012 issued in U.S. Appl. No. 11/890,790.
US Office Action dated Dec. 27, 2010 issued in U.S. Appl. No. 11/890,790.
US Final Office Action dated Dec. 10, 2012 issued in U.S. Appl. No. 11/890,790.
US Final Office Action dated Jun. 10, 2011 issued in U.S. Appl. No. 11/890,790.
US Notice of Allowance dated Feb. 21, 2013 issued in U.S. Appl. No. 11/890,790.
US Office Action (*Ex Parte Quayle*) dated Nov. 19, 2012 issued in U.S. Appl. No. 12/462,424.
US Office Action dated Apr. 26, 2012 issued in U.S. Appl. No. 12/462,424.
US Notice of Allowance dated May 2, 2013 issued in U.S. Appl. No. 12/462,424.
PCT International Search Report and Written Opinon dated Apr. 12, 2011 for PCT/US2010/043425.
KR Office Action dated Oct. 24, 2011 issued in USSN 10-2010-7027667.
KR Office Action dated May 28, 2012 issued in USSN 10-2010-7027667.
KR Office Action dated Mar. 23, 2011 issued in USSN 10-2009-0067246.
SG Office Action dated Oct. 27, 2011 issued in USSN 200905176-4.
TW Search Report dated Oct. 15, 2012 issued in USSN 098125712.
JP Office Action dated Dec. 18, 2012 issued in USSN 2009-207571.
JP Office Action dated Jul. 9, 2013 issued in USSN 2009-207571.
PCT International Search Report and Written Opinion dated Apr. 12, 2011 issued in PCT/US2010/047181.
PCT International Preliminary Report on Patentability and Written Opinion dated Mar. 15, 2012 issued in PCT/US2010/047181.
TW Office Action dated Feb. 23, 2013 issued in TW USSN 099129741.
Aksu et al., Electrochemistry of Copper in Aqueous Ethylenediamine Solutions, Journal of The Electrochemical Society, 149 (7) B340-B347 (2002).
Aksu et al., "The Role of Glycine in the Chemical Mechanical Planarization of Copper," Journal of The Electrochemical Society, 149 (6) G352-G361 (200), Department of Materials Science and Engineering, University of California, Berkeley, Berkeley, California 94720-1760, USA.
Andryuschenko et al., "Electroless and Electrolytic Seed Repair Effects on Damascene Feature Fill," *Proceedings of International Interconnect Tech. Conf.*, San Francisco, CA., Jun. 4-6, 2001, pp. 33-35.
Chen et al., "ECD Seed Layer for Inlaid Copper Metallisation," Semiconductor Fabtech—12th Edition, 5 Pages, Jul. 2000.
Choi et al., Dissolution Behaviors of Copper Metal in Alkaline $H^2O^2$—EDTA Solutions, Journal of Nuclear Science and Technology, 30(6), pp. 549-553 (Jun. 1993).
Colgan, E.G, "Selective CVD-W For Capping Damascene Cu Lines," Thin Solid Films, 262 (1995), 120-123.
Enhanced Copper Metallurgy for BEOL Application, IBM Technical Disclosure Bulletin, (1990) 33 95:217-218.
Hu et al., (2002) "Reduced Electromigration of Cu Wires by Surface Coating," Applied Physics Letters, vol. 81(10):1782-1784.
Hu et al., "Effects of Overlayers on Electromigration Reliability Improvement for Cu/Low K Interconnects," Presented in the Proceedings of the 42nd Annual IRPS held Apr. 25-29, 2004, p. v, article published May 28, 2004, 7 Pages.
Itabashi et al., "Electroless Deposited CoWB for Copper Diffusion Barrier Metals," Hitachi Research Laboratory, IEEE, 2002, 285-287.
Mayer et al., "Pad-Assisted Electropolishing," Novellus Systems, Inc., U.S. Appl. No. 11/213,190, filed Aug. 26, 2005.
Mayer et al., "Topography Reduction and Control by Selective Accelerator Removal," Novellus Systems, Inc., U.S. Appl. No. 11/602,128, filed Nov. 20, 2006.
Moffat T.P. et al., "Superconformal Electrodeposition of Copper in 500-90 nm Features," Journal of the Electrochemical Society, 147 (12) 4524-4535 (2000).
Mori et al., "Metal Capped Cu Interconnection Technology by Chemical Mechanical Polishing," VMIC Conference, 1996, 487-492.
Mukherjee et al., (© 2000) "Planarization of Copper Damascene Interconnects by Spin-Etch Process: A Chemical Approach", *Mat. Res. Soc. Symp.*, vol. 612, Materials Research Society, 6pp.
O'Sullivan et al., Electrolessly Deposited Diffusion Barriers for Microelectronics, E.J. IBM J Res Develop vol. 42, No. 4 Sep. 1998, 607-620.
O'Sullivan, Eugene J. "Electroless Deposition in Microelectronics: New Trend," Electrochemical Society Proceeding vol. 99-34, 159-171.
Park et al., "Electroless Layer Plating Process and Apparatus", Novellus Systems, Inc., U.S. Appl. No. 10/235,420, filed Sep. 30, 2002.
Patri et al., Role of the Fuctional Groups of Complexing Agents in Copper Slurries, Journal of The Electrochemical Society, 153 (7) G650-G659 (2006).
Petrov N. and Shacham-Diamand Y., "Eclectrochemical Study of the Electoless Deposition of Co(W,P) Barrier Layers for Cu Metallization," Electrochemical Soc. Proceedings, vol. 2000-27, 134-148.
Reid et al., "Copper PVD and Electroplating," Solid State Technology, Jul. 2000, www.solid-state.com, 86-103.
Reid et al., "Factors Influencing Fill of IC Features Using Electroplated Copper," Adv Met Conf Proc 1999, MRS 10 Pages, (2000).
Reid et al., "Optimization of Damascene Feature Fill for Copper Electroplating Process," Shipley Company, IITC 1999, 3 Pages.
Ritzdorf et al., "Electrochemically Deposited Copper," Conference Proceedings ULSI XV 2000, *Materials Research Society*, 101-107.
SanderKok.com, "Analytical Chemistry", http//home.planet.nl/-skok/ttechniques/laboratory/pka_pkb.htm.
Shacham-Diamand, Yosi and Lopatin, Sergey, (1999) "Integrated Electroless Metalization for ULSI," *Elecrochimica Acta*, 44:3639-3649.
Shacham-Diamond et al., "Copper Electroless Deposition Technology for Ultr-Large-Scale-Integration (ULSI) Metallization," Microelectronic Engineering 33 (1997) 47-58.
Takahashi, Ken M., "Electroplating Copper into Resistive Barrier Films," Journal of the Electrochemical Society, 147 (4) 1417-1417 (2000).
Theoretical Studies on the Electroless Metal Deposition Reaction Mechanism Group, printed issued in website http://www.appchem.waseda.ac.jp on Jul. 3, 2002. Published prior to the filing of this application. 3 pages.
Wolf, "Silicon Processing for the VLSI Era", *Lattice Press*, vol. 3, p. 648.
US Office Action dated Aug. 28, 2014 issued in U.S. Appl. No. 14/072,944.
PCT International Preliminary Report on Patentability dated Feb. 16, 2012 issued in PCT/US2010/043425.
CN Second Office Action dated Aug. 20, 2014 issued in 201080034653.1.
CN Second Office Action dated Jul. 2, 2014 issued in CN200910164003.8.
CN Second Office Action dated Oct. 8, 2014 issued in CN201080039039.4.

\* cited by examiner

US 9,074,286 B2

WET ETCHING METHODS FOR COPPER REMOVAL AND PLANARIZATION IN SEMICONDUCTOR PROCESSING

CROSS REFERENCE TO RELATED PATENT APPLICATION

This application is a continuation claiming priority from U.S. patent application Ser. No. 12/535,594 filed on Aug. 4, 2009 titled "Wet Etching Methods for Copper Removal and Planarization in Semiconductor Processing" naming Steven T. Mayer et al. as inventors (issued as U.S. Pat. No. 8,372,757 on Feb. 12, 2013), which is a continuation-in-part claiming priority from U.S. patent application Ser. No. 11/888,312 filed on Jul. 30, 2007 (issued as U.S. Pat. No. 7,972,970 on Jul. 5, 2011), titled "Method for Fabrication of Semiconductor Interconnect Structure" naming Steven T. Mayer et al. as inventors, which is a continuation-in-part claiming priority from U.S. patent application Ser. No. 11/586,394 filed Oct. 24, 2006 (issued as U.S. Pat. No. 7,531,463 on May 12, 2009), titled "Method for Fabrication of Semiconductor Interconnect Structure" naming Daniel A. Koos et al. as inventors, which is a continuation-in-part claiming priority from U.S. patent application Ser. No. 10/690,084 filed Oct. 20, 2003 (issued as U.S. Pat. No. 7,338,908 on Mar. 4, 2008), titled "Method for Fabrication of Semiconductor Interconnect Structure with Reduced Capacitance, Leakage Current, and Improved Breakdown Voltage," naming Daniel A. Koos et al. as inventors. U.S. patent application Ser. No. 12/535,594 is also a continuation-in-part application claiming priority to U.S. patent application Ser. No. 11/602,128, filed Nov. 20, 2006 (issued as U.S. Pat. No. 8,158,532 on Apr. 17, 2012), by Mayer et al., having the title "Topography Reduction and Control by Selective Accelerator Removal", which claims the benefit under 35 USC 119(e) of U.S. Provisional Application Ser. No. 60/737,978, filed Nov. 19, 2005, by Mayer et al. U.S. patent application Ser. No. 11/602,128 is also a continuation-in-part application, claiming priority to U.S. patent application Ser. No. 11/544,957, filed Oct. 5, 2006 (issued as U.S. Pat. No. 7,799,200 on Sep. 21, 2010), by Mayer et al., which claims the benefit of U.S. Provisional Application Ser. No. 60/724,209, filed Oct. 5, 2005, titled "Selective Electrochemical Accelerator Removal". U.S. patent application Ser. No. 11/602,128 is also a continuation-in-part application, claiming priority to U.S. patent application Ser. No. 10/824,069, filed Apr. 13, 2004 (issued as U.S. Pat. No. 7,405,163 on Jul. 29, 2008), by Drewery et al., having the title "Selectively Accelerated Plating of Metal Features". U.S. patent application Ser. No. 11/602,128 is also a continuation-in-part application, claiming priority to U.S. patent application Ser. No. 10/739,822, filed Dec. 17, 2003 (issued as U.S. Pat. No. 7,449,098 on Nov. 11, 2008), by Mayer et al., having the title "Method for Planar Electroplating". U.S. patent application Ser. No. 11/602,128 is also a continuation-in-part application, claiming priority to U.S. patent application Ser. No. 10/690,084, filed Oct. 20, 2003 (issued as U.S. Pat. No. 7,338,908 on Mar. 4, 2008), by Koos et al., titled "Method For Fabrication Of Semiconductor Interconnect Structure With Reduced Capacitance, Leakage Current, And Improved Breakdown Voltage". U.S. patent application Ser. No. 11/602,128 is also a continuation-in-part application, claiming priority to U.S. patent application Ser. No. 10/693,223 filed Oct. 24, 2003 (issued as U.S. Pat. No. 7,189,647 on Mar. 13, 2007), by Patton et al., titled "Sequential Tool for Wet Processing of Semiconductor Wafers". Each of these documents is incorporated herein by reference in its entirety and for all purposes.

FIELD OF THE INVENTION

This invention pertains to methods of wet chemical etching. More particularly this invention pertains to wet etching methods for copper removal and planarization in semiconductor processing.

BACKGROUND

Copper and copper alloys are widely used in the field of semiconductor fabrication as conducting materials. As a conductor, copper is often preferred to other metals, such as aluminum, due to its high electrical conductivity and good electromigration resistance properties. Because of these advantages, copper-filled lines and vias are now ubiquitously seen as conducting paths connecting elements of semiconductor devices, such as in integrated circuits.

Processing of copper during fabrication of semiconductor devices, however, presents a set of challenges. Because copper is not easily amenable to plasma etching, copper-containing devices typically need to be fabricated using damascene processing. In damascene processing, copper is deposited as an inlay on a substrate having a pattern of pre-formed recessed damascene features, such as vias and trenches. The pattern of recessed features is usually formed by photolithographic techniques. After the recessed features have been formed, copper is globally deposited onto the substrate such that it fills the recessed features and also forms an overburden layer over the field region, wherein the field region refers to the top plane of the substrate prior to copper deposition. Subsequently, the overburden is removed by a planarization technique such as chemical mechanical polishing (CMP), providing a planarized substrate having a pattern of copper-filled conductive paths.

While methods for efficient copper removal are desirable at various stages of semiconductor device fabrication, conventional wet copper etching techniques have not been widely introduced because they generally could not be successfully integrated into semiconductor device fabrication processes. One of significant drawbacks of conventional etching chemistries includes their anisotropic nature. Anisotropic etching leads to preferential etching of copper in one specific direction and/or preferential etching of one type of grain orientation and, consequently, leads to roughening of copper surface, pitting, and grain boundary dependent non-uniform copper removal. Furthermore, anisotropic etch rates are typically higher on those surfaces that are more exposed to the bulk etching solution. For example, with conventional anisotropic etching, edges of an isolated feature, or features at edges of pattern array will etch with different properties and rates compared to those areas that are more removed from (and less exposed to) the bulk of the etching solution. This drawback, in many instances, cannot be tolerated in semiconductor fabrication where clean, smooth, and isotropic removal of copper is typically desired. Common examples of known acidic copper etches that are anisotropic include: a nitric acid etch, where nitric acid is used typically alone and acidic mixtures containing an oxidizing agent, such as hydrogen peroxide, permanganate, ferric ion, bromine, and chromium (VI) and an acid (e.g., acetic or sulfuric). Common examples of known neutral and alkaline etches that are anisotropic include: ammonium or alkali metal persulfate solutions, ferric chloride based solutions, and ammonium hydroxide based solutions.

SUMMARY

In one aspect, a wet etching solution for substantially isotropically removing copper-containing metal is provided. In one embodiment the wet etching solution comprises a (i) bidentate, tridentate or quadridentate complexing agent selected from the group consisting of a diamine, a triamine, and a tetramine; (iii) an oxidizer; and a pH adjustor, wherein the pH of the etching solution is between about 5 and about 12, such as between about 7 and 10.5. In some embodiments the pH adjustor is selected from the group consisting of an aminoacid, an alkylsulphonic acid, sulfuric acid, and a carboxylic acid. The solution can also comprise mixtures of complexing agents, mixtures of oxidizers, and mixtures of pH-adjusting agents. In some embodiments, the wet etching solution comprises a diamine and/or a triamine, a peroxide and an aminoacid, wherein the pH of solution is adjusted to a range of between about 7 and 10.5. Examples of suitable complexing agents include without limitation ethylenediamine (EDA, $H_2NCH_2CH_2NH_2$), N-methylethylenediamine ($CH_3NHCH_2CH_2NH_2$), diethylenetriamine ($H_2NCH_2CH_2NHCH_2CH_2NH_2$), tetraethylenetriamine ($H_2NCH_2CH_2NHCH_2CH_2NHCH_2CH_2NH_2$) and tris(2-aminoethyl)amine (tren, $N(CH_2CH_2NH_2)_3$). Examples of oxidizers include without limitation peroxides, persulfates, ozone solution, ferric ion containing solutions, of which hydrogen peroxide is often preferred. Examples of pH adjustors include sulfuric acid, glycine, methanesulphonic acid, acetic acid, citric acid, glyoxylic acid, oxalic acid, etc. In some embodiments, the solutions include a mixture of sulfuric acid, an aminoacid, and a carboxylic acid.

A method of etching a copper-containing metal from the surface of the semiconductor substrate includes contacting the substrate with the wet etching solution, including but not limited to by spraying the etching solution on the substrate from spray nozzles, delivering the solution from jet nozzles, from a showerhead, by immersing the substrate into solution (preferably with agitation), by contacting the substrate in a thin film reactor or by a spin on contact method. In some embodiments, the wet etching solution is used to remove copper-containing overburden during processing of a damascene feature (such as a through-silicon via (TSV)). In some embodiments, the wet etching solution removes at least about 1 µm thick such as at least about 5 µm thick layer of copper-containing metal at an etch rate of at least about 1,000 Å/minute, and without significantly increasing surface roughness of the etched layer. In some embodiments, in the wet etching solution the oxidizer is used in molar excess to obtain the best isotropic etching characteristics. For example, etching solutions in which molar ratio of oxidizer to a complexing agent is at least about 2.5:1, such as at least about 3:1 are preferred in some embodiments. The provided solutions can be used to remove large amounts of copper-containing metal without causing substantial surface roughening and without visible formation of insoluble copper species on the surface. Thus, in some embodiments, a surface that is smooth, bright, and reflective at the beginning of the etch process will remain substantially smooth, bright, and reflective at the end of the etching. Further, in some embodiments, provided etching compositions can be used for isotropic planarization of surfaces containing recessed and/or protruding features, whereby the isotropic etching can function to reduce the aspect ratios of these features.

In another aspect, a method of processing a damascene feature on a partially fabricated semiconductor substrate is provided, wherein the method utilizes a combination of electrodeposition and isotropic wet chemical etching to planarize an unwanted recessed feature in copper overburden. In one embodiment, the method includes: (a) receiving a semiconductor substrate having a field region and at least one recessed damascene feature formed in the substrate, wherein the substrate is lined with a layer of conductive material; (b) completely electrochemically filling the recessed damascene feature with a copper-containing metal and forming a copper-containing overburden over the field region, wherein the overburden comprises a recess over the filled recessed damascene feature, said recess having substantially the same depth as the overburden thickness; (c) continuing electrodepositing copper-containing metal over the substrate to deposit additional overburden material over the field region while substantially reducing the aspect ratio of the recess in the overburden, wherein the thickness of additional overburden material deposited over the field region is at least about 50% of the thickness of the overburden deposited in (b); and (d) wet etching the copper-containing overburden to remove at least all additional overburden deposited in (c) by contacting the substrate with an isotropic wet etching solution, said solution comprising a complexing agent and an oxidizing agent and having a pH in the range of between about 5 and 12, wherein wet etching further reduces the aspect ratio of the recessed feature. In some embodiments the etching in (d) substantially isotropically removes at least 1 µm of copper-containing overburden, e.g., at least 5 µm of copper containing overburden at an etch rate of at least about 1000 Å/minute. The overburden can be removed partially or completely by wet chemical etching. In some embodiments, after the overburden has been partially removed by wet etching, the remaining overburden and diffusion barrier are removed by an anisotropic planarization technique, such as chemical mechanical polishing (CMP). In other embodiments, the diffusion barrier layer (e.g., material selected from the group consisting of titanium, titanium nitride, tungsten, tungsten nitride, tantalum and tantalum nitride) is removed by wet chemical etching that is selective to copper, cobalt or nickel, which may reside in the top portions of metal lines.

In a third aspect a method for removing a layer of diffusion barrier material from a semiconductor substrate is provided, wherein the method includes: (a) receiving the substrate comprising an exposed layer of diffusion barrier material selected from the group consisting of titanium, titanium nitride, tungsten, tungsten nitride, tantalum and tantalum nitride and an exposed layer of metal selected from the group consisting of copper, nickel and cobalt; (b) contacting the substrate with a hot concentrated alkaline solution to completely remove the diffusion layer without substantially removing the metal layer. For example, alkaline solutions having a temperature of at least about 70° C. can be used for this purpose.

In a fourth aspect, a method of quenching the etching reaction (e.g., reducing the rate of the etching reaction or stopping the etching reaction) is provided. The method includes: (a) contacting the substrate with an isotropic wet etching solution comprising: (i) a complexing agent selected from a group consisting of a bidentate, a tridentate, and a quadridentate complexing agent and (ii) an oxidizer, the wet etching solution having a pH of between about 5 and 12, whereby copper-containing metal is etched; and (b) increasing the pH of the etching solution from its initial value used in (a) to reduce the rate of the etching reaction or to stop the etching reaction. For example addition of basic pH-adjustors, such as metal hydroxides, and tetraalkylammonium hydroxides to increase the pH of the etching solution (e.g., from 9 to 12 or higher) can be used to quench the etching reaction.

In a fifth aspect, a method of etching and cleaning is provided, wherein the etching and the cleaning use similar chemistries (e.g., similar pH range of between 5 and 12) is provided. The method includes: (a) contacting the substrate with an isotropic wet etching solution comprising: (i) a complexing agent selected from a group consisting of a bidentate, a tridentate, and a quadridentate complexing agent and (ii) an oxidizer, wherein the wet etching solution has a pH of between about 5 and 12, whereby copper-containing metal is etched; and (b) contacting the substrate with a cleaning solution comprising (i) a complexing agent selected from a group consisting of a bidentate, a tridentate, and a quadridentate complexing agent, wherein the cleaning solution has a pH of between about 5 and 12.

The etching solutions comprising complexing agents and oxidizers (particularly peroxides) are, in some embodiments, not stable over long periods of time, and in some embodiments, are prepared shortly before etching. In one embodiment the solutions are prepared from a pH adjusted concentrated solution of a complexing agent (including mixtures of complexing agents). In the sixth aspect, a concentrated solution for preparing a wet etching solution for copper etching is provided. In one embodiment the concentrated solution consists essentially of: (a) water; (b) one or more polyamines selected from the group consisting of a bidentate diamine, a tridentate triamine and a quadridentate tetramine, wherein the concentration of aminogroups derived from these polyamines is at least about 1.5 M; and (c) one or more pH adjustors selected from the group consisting of sulfuric acid, an alkyl-sulphonic acid, a carboxylic acid, and an aminoacid, wherein the concentrated solution has a pH of between about 8.5 and 11.5 at 21° C.

In a seventh aspect a method for preparing a wet etching solution is provided. In one embodiment, the method involves combining the concentrated solution described above with an aqueous solution of an oxidizer (e.g., hydrogen peroxide). In some embodiments the wet etching solution is used for wet etching copper-containing no later than 10 minutes after preparation.

In an eighth aspect an apparatus for wet chemical etching is provided, wherein the apparatus is adapted for improving etching uniformity. In one embodiment, the apparatus includes (a) a wafer pedestal adapted for supporting the wafer in the etching position; (b) at least two etch nozzles adapted for spraying an etchant onto the wafer; and (c) a controller having program instructions for setting or modulating at least one of the following parameters selectively for the at least two nozzles: (i) nozzle position with respect to the wafer; (ii) time of etchant delivery from the at least two nozzles; (iii) composition of etchant delivered from the at least two nozzles; (iv) flow of quenching solution delivered from at least one nozzle; (v) flow rate of the etchant from the at least two nozzles; (vi) concentration of at least one component in the etchant delivered from the et least two nozzles; and (vii) shape of flow pattern delivered from the at least two nozzles.

These and other features and advantages of the invention will be described in more detail below, with reference to the associated drawings.

DETAILED DESCRIPTION OF A PREFERRED EMBODIMENT

Wet Etching Compositions for Copper Removal

Figure 1A:
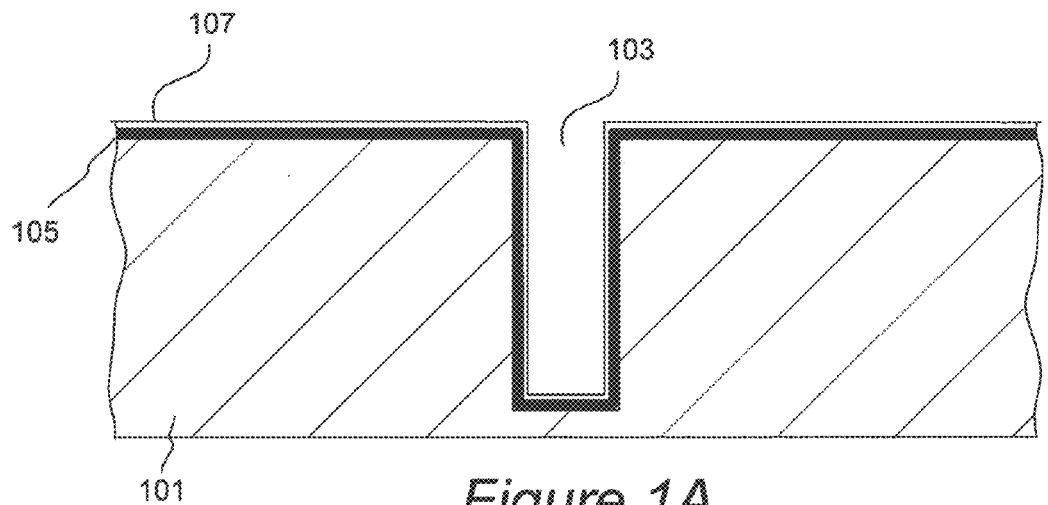
FIGS. 1A-1C illustrate cross sectional views of a portion of a damascene structure during fabrication of through-silicon via (TSV), in accordance with an embodiment of the invention.

Etching of copper-containing metal can be accomplished with the use of particular wet etching solutions containing an oxidizing agent and a complexing agent. It was unexpectedly discovered that the nature of complexing agent is of particular importance when isotropic uniform etching without significant pitting or roughening is desired. Etching compositions that provide high etch rates (e.g., at least about 1,000 Å/minute, preferably at least about 2,000 Å/minute, e.g. at least about 4,000 Å/minute) in the pH range of between about 5-12, preferably between about 6-10 were developed. The compositions comprise an aqueous solution comprising one or more of a bidentate, tridentate or qudridentate complexing agent (e.g., an aminoacid, ethylenediamine, diethylenetriamine, etc.) and an oxidizer (e.g., a peroxide). The compositions with bidentate, tridentate and quadridentate ligands provide superior etching properties compared to compositions comprising complexing agents having denticities greater than 4 (e.g., ethylenediaminetetraacetic acid (EDTA)) or strong unidentate complexing agents (e.g., ammonia). The etching solutions can be delivered onto the substrate using a variety of methods, such as by spraying from one or more spray nozzles, delivering the etchant from jet nozzles, delivering the etchant from a showerhead, etching in a thin film reactor or by a spin on contact method. In some embodiments the substrate can be simply immersed into the etchant, preferably with some form of solution agitation.

Significantly, in many embodiments, etching with provided compositions occurs at substantially similar rates in all directions,—that is, the etch is substantially isotropic. For example, etching within the recessed features (or copper-filled lines) of different sizes can occur largely uniformly across a given feature's width and at substantially the same or similar rates for features of greatly differing widths. Further, in some embodiments, different surfaces within the recessed features are etched at substantially the same or similar rates, e.g., etching at the copper/feature interface at the feature center or in a feature corner can occur at substantially similar rates. Etching with the described compositions also, in many embodiments, occurs uniformly across the wafer, with little etch rate variation between the central portions and the edges of the wafer. The etching is preferably non-grain specific, e.g., it does not occur at substantially higher rates at grain boundaries, and therefore does not result in undesired faceting. The etch rate is preferably feature size, feature depth, feature location within an array, and feature array pitch independent. Further, in many embodiments, the isotropic etching compositions provided herein, provide reduced pitting and surface roughness and afford smooth oxide-free surfaces having high reflectivity.

In contrast, conventional copper etching compositions, e.g., etching compositions having low pH of less than about 5, commonly exhibit anisotropic behavior, with etch rates within smaller features being substantially greater than etch rates within larger features. Further, high pitting and surface roughness are observed with the use of conventional etching compositions.

The unusual isotropic behavior of the etching compositions described herein is attributed to the rate-limiting reaction occurring at the copper surface. Without being bound by a particular theory, it is believed that in the pH range of between about 6-12, copper oxide is being formed at the copper surface and is immediately or after a very short time is solubilized and removed by the complexing agent of the copper etching composition. It is noted, that advantageously, etching compositions described herein, in some embodiments, do not form a layer of copper oxide resident on copper surface, but instead afford a smooth oxide-free copper surface having high reflectivity (e.g., a reflectivity of greater than 120% of the reflectivity of a bare silicon wafer at 480 nm, after 5,000 Å etch). Thus, if any oxide is being formed during the etching reaction, it is immediately or very quickly removed in situ, such that an additional oxide-removing operation, is not always required. It is understood, however, that in some embodiments isotropic etching compositions may form a layer of oxide resident on the surface, which may be removed in a subsequent separate removal and cleaning operation.

The invention is not limited by the advantageous features described above, and these features need not be simultaneously exhibited by a particular etching composition. For example, some compositions may exhibit very good isotropic behavior but may have a relatively low etch rate (e.g., exhibiting etching rates of between about 100-1000 Å/minute). Other compositions may provide very fast etching rates, e.g., greater than 3,000 Å/min but are not necessarily perfectly isotropic. Many compositions will exhibit some or all of the desired characteristics. All of these compositions are within the scope of the invention. However, it is particularly advantageous that compositions that exhibit both high etching rates (e.g., rates of greater than 1,000 Å/minute) and very good isotropic behavior are provided. In some embodiments, improved isotropic behavior of the etching compositions is associated with using an excess of oxidant with respect to complexing agent on a molar basis. For example, in some embodiments, the molar ratio of the oxidizer to the complexing agent (or several complexing agents), e.g., a ratio of hydrogen peroxide and EDA concentrations, in the etching solution is at least about 2.5 to 1, such as at least about 3 to 1, and in some implementations is at least about 5 to 1.

In some embodiments the isotropic behavior of the etchant is determined by measuring surface roughness of copper layer prior to etching and after etching. Changes in surface roughness can be assessed by measuring changes in reflectivity of the copper surface. Reflectivity is generally useful as a qualitative comparator of the micro-roughness of similar surfaces, for example, of oxide-free copper surfaces. In many embodiments etching with provided etchants does not lead to an initial rate of decrease in reflectivity of more than about 15% per 1,000 Å of etched copper. In some embodiments reflectivity is not initially decreased by more than 10%, such as by more than 2%, such as by more than 1% per 1,000 Å of etched copper. Reflectivity can be measured, for example, by a reflectivity measuring tool, such as a NanoSpec 3,000 Spectroscopic Reflectometer available from Nanometrics, Milpitas Calif., standardized to the reflectivity of a silicon wafer at a wavelength of 480 nm, and is typically given as a percent value relative to reflectivity of a silicon surface. For example, a micro-smooth surface oxide free electrodeposited copper layer can have a reflectivity value of between about 130% to 140% relative to silicon. The same smooth electrodeposited copper layer with a visually obvious surface film of cuprous oxide (tarnished appearance) will have a substantially lower reflectivity, for example less than 90% (depending on the films thickness). Therefore, both the micro-roughness and the thickness of the surface oxide can affect the measured reflectivity value. In order to determine change in reflectivity and to assess surface roughening, reflectivity of copper layer is measured before and after etching, and the change in the number is normalized to 1,000 Å of copper etched. For example, if prior to etching copper reflectance is R1=135%, and the reflectance decreases to R2=120% after D=4200 Å of copper has been removed, the change in reflectance is calculated as [(R2−R1)/(R1×D)]×100%×1000=2.6% (per 1,000 Å removed). The post-etch measurement is often repeated again after exposure of the surface to a spray or 1% sulfuric acid for 2-5 seconds, followed by an immediate DI water rinse. This procedure will rapidly remove a surface oxide without substantially removing any underlying metal or roughening the surface, and generally confirms a post-etch oxide-free reflectance result. For the isotropic etch formulations presented here, in many embodiments there is no significant difference between these two values, indicating that the surface post-etch is oxide-free.

In some embodiments, the reflectivity of copper layer obtained after etching is even higher than before etching. This may occur because the provided etchants in some cases make rough surfaces smoother, and can even be used for planarization of copper layers, as it will be subsequently described. Since it is theoretically possible that the same observation of reflectivity increase could have been made if the plated wafer had a pre-existing very thin residual oxide film, the same dilute acid and rinse described above was applied before etching, with the results indicating that the reflectivity increase was a result of a smoothing/polishing behavior of the etchant on copper metal rather than simply because of removing a very thin post-plated surface oxide.

In some embodiments, provided etching methods further result in good center-to-edge nonuniformity values on semiconductor wafers. For example, processes with removal rate nonuniformities of less than about 10%, such as less than about 2% and less than about 1% are provided. These nonuniformity values can be achieved due to the advantageous properties of isotropic etchants, and in some embodiments due to use of provided chemistries in combination with the use of two or more separate spray dispensers (e.g., nozzles) that are configured for spraying non-intersecting fronts of the etching solution onto the rotating wafer substrate. Further, in some embodiments improved uniformity is achieved due to modulation of parameters in etchant delivery systems (e.g., due to modulation of spray nozzle dwell times, location and dynamic modification of the nozzle positions, changes in etch composition, rinse water delivery, etch quencher delivery, etc), or due to combination of the two or more of these parameters. Because the isotropic etch is primarily a surface-controlled (and not diffusion-controlled) reaction process, delivery of the fluid simultaneously and uniformly to the entire surface is generally not required to achieve a substantially uniform removal rate distribution. As such, the minimal amount of fluid that is required to maintain a wet surface can be more effectively utilized, whereas the modulation and active control of copper removal profiles are more easily achieved.

Referring again to the chemistries of provided etchants, in one embodiment the isotropic etching compositions are aqueous solutions which include an oxidizing agent (e.g., a peroxide, a persulfate, a permanganate, ozone, an $Fe^{3+}$ salt, etc.) and a bidentate, tridentate or quadridentate complexing agent. Mixtures of complexing agents can also be used. Preferably, the complexing agent has at least one amino group. The other coordinating group or groups may include a variety coordinating moieties, e.g., a carboxylate and/or another amino group. In some embodiments, polyamines are preferred. Examples of suitable complexing agents include without limitation aminoacids, diamines, triamines, and tetramines. In some embodiments, complexing agents having phosphonic groups are excluded from the scope of the invention.

Hydrogen peroxide is a preferred oxidizing agent in some embodiments, due to its high solubility, low toxicity, and low cost, although other oxidants can also be used. It is understood, that dioxygen, which may be dissolved in the etching solution exposed to an ambient atmosphere is generally not regarded as an oxidant for the purposes of this invention. Additionally, it is noted that the compositions described herein are wet etching solutions and are distinct from CMP slurries in that they do not contain abrasive particles, and their utility does not rely on surface abrasion to achieve their results.

As it was mentioned, the nature of complexing agent was found to be of particular importance. For example, simple unidentate ligands, such as ammonia, and large carboxylate-rich multidentate ligands, such as ethylenediaminetetraacetic acid (EDTA) were found to afford low etch rates and/or to lead to surface oxide formation or poor isotropic behavior. In a preferred embodiment the copper etching solution is substantially free of ammonia, ammonium ion, from EDTA and its salts, and from ligands having denticities of greater than four.

Unexpectedly, unlike EDTA and ammonia, many aminoacids and diamines, such as glycine and ethylenediamine (EDA) were found to provide excellent etch rates, isotropic behavior, low surface roughness, and no residual surface oxide.

In addition to complexing agents and oxidizing agents, the etching solutions may optionally include one or more pH adjustors. pH adjustors may be basic or acidic, depending on the desired pH. Basic pH adjustors include without limitation alkali metal hydroxides, and tetraalkylammonium hydroxides, such as tetramethylammonium hydroxide (TMAH). Acidic pH adjustors include in some embodiments acids, such as sulfuric acid, alkylsulphonic acids (e.g., methanesulphonic acid) and carboxylic acids (e.g., acetic acid, oxalic acid, citric acid, and glyoxylic acid). In some embodiments, aminoacids, such as glycine are used both as pH adjustors and as complexing agents.

"Aminoacids" as used herein include both biologically occurring (natural) and unnatural aminoacids, and refer to molecules having at least one carboxylic group and at least one amino group. Aminoacids may be optionally substituted with a variety of substituents. In a preferred embodiment, aminoacids include a non-substituted primary aminogroup, although in other embodiments, aminoacids may be N-derivatized. Aminoacids, as used in this application do not include compounds having denticities greater than four, such as EDTA.

Glycine, DL-alanine, beta-alanine, serine, DL-methionine, and DL-valine were found to be suitable complexing agents for isotropic etches. Results for aminoacids having bulkier substituents, such as leucine, glutamine, aspartic acid, tyrosine, cystine, and N-methylated aminoacid sarcosine showed generally lower etch rates.

Examples of typical etching compositions comprising aminoacids include compositions having a pH of between about 6-10, an aminoacid (e.g., glycine) and $H_2O_2$. Highest etch rates were observed at $H_2O_2$:glycine molar ratio of about 1:2. Buffering agents, corrosion inhibitors, and pH adjustors (such as tetramethylammonium hydroxide) can be added to the compositions as needed.

In some embodiments, diamines, triamines, and tetramines are used as complexing agents, of which diamines and triamines are preferred. These can be derivatized at nitrogen (e.g., can be N-alkyl substituted) or at other positions. Examples include ethylenediamine (EDA, $H_2NCH_2CH_2NH_2$), N-methylethylenediamine ($CH_3NHCH_2CH_2NH_2$), diethylenetriamine ($H_2NCH_2CH_2NHCH_2CH_2NH_2$), tetraethylenetriamine ($H_2NCH_2CH_2NHCH_2CH_2NHCH_2CH_2NH_2$) and tris(2-aminoethyl)amine (tren, $N(CH_2CH_2NH_2)_3$). Compositions containing mixtures of diamines and/or triamines and/or aminoacids can also be used and in some cases possess synergistic etch rate behaviors. As a specific example, the mixtures of the weak base ethylene diamine, combined and pH-adjusted using the weak amino acid glycine, to a pH of between 6-10, exhibit an etch rate that is significantly greater than the simple sum of the etch rate using the same complexing and oxidizing constituents at the same concentrations separately (for example, 30% greater or more), while simultaneously improving the isotropic behavior (e.g. resulting in less surface roughening at similar thicknesses of copper removed). In some embodiments, the etching compositions include a diamine and an aminoacid (e.g., glycine), a triamine and an aminoacid, or a mixture of a diamine, triamine and an aminoacid. Further, in some embodiments, each of these compositions includes sulfuric acid, and/or a carboxylic acid and/or an alkylsulfonic acid, with the pH being adjusted to a range of about 7-10.5.

Diamine-containing etching compositions afford very high etch rates and lead to smooth metal surfaces having very high reflectivity. Triamine-containing and tetramine-containing compositions are also suitable for isotropic etches. Because polyamines typically provide solutions with high pH, in some embodiments acidic pH adjustors are added to the etching solution to reduce the pH to a preferred range. For example, in some solutions containing a diamine and/or a triamine it is preferable to adjust pH to between about 7-10.5, more typically to about 8.5-9.5 by an acidic pH adjustor. Unexpectedly, not every acid is suitable to serve as a pH adjustor in these etching systems. Suitable pH adjustors include aminoacids (e.g., glycine) which can also serve as an auxiliary complexing agent, carboxylic acids (e.g., acetic acid, propionic acid, glyoxylic acid, citric acid, oxalic etc.), alkylsulphonic acid (e.g., methanesulphonic acid), and sulfuric acid. In contrast, carbonic and phosphoric acids, which form copper salts of limited solubility and appear to otherwise interfere with the process as described above, are less preferred. Hydrochloric and hydrobromic acids appears to interfere with the isotropic etching mechanism and are also less preferred. Further, in some embodiments toxic or explosive acids, such as perchloric acid, are preferably, not used. Typically, aminoacids, and acids which form highly soluble copper salts, are preferred pH adjustors. It is understood that at the provided pH ranges the recited pH-adjustors typically are present in solution not in their free acidic form, but as corresponding conjugate bases. For the purposes of this application an etching solution "comprising an acidic pH adjustor (e.g., sulfuric acid)" is understood to mean that the pH adjustor (e.g. sulfuric acid) is not necessarily fully protonated, but is present in those forms that exist at the recited pH values.

While pH adjustment of basic polyamine-containing solutions is preferred in many embodiments in order to achieve either high etching rates or optimal isotropic behavior, in other embodiments, diamines and triamines are used with very little or simply without such pH adjustment.

When an aminoacid is used as the major complexing agent of the etching solution, addition of basic pH adjustor is occasionally required to bring the pH of etching solution to an optimum level. For example, tetramethylammonium hydroxide can be used as a basic pH adjustor.

Concentration of complexing agents and oxidizer, as well as pH and temperature of etching solutions can be used to modulate the etching rates and isotropic behavior of the wet etches.

The temperature of etching solutions can range widely, e.g., from about 0° C. to about 70° C., above which the stability of the alkaline mixtures, particularly that of the oxidizer agent, is considerably limited. Typically etching is performed at temperatures of between about 20° C. and 30° C. In some embodiments it is preferable to conduct etching above room temperature (above 25° C., e.g., at about 45° C.) to achieve reduced pitting and improved etch rate. In some embodiments, these temperatures are achieved by using exothermic mixing of etching solution components shortly before etching is performed.

The concentrations of the complexing agent, the oxidizing agent and the pH adjustor can be varied depending on the specific application of the etchant, the amount of metal that needs to be removed, the surface roughness that can be tolerated, etc. Typically, the concentration of the complexing agent in the etch delivered to the surface of the substrate can be varied in the range from about 0.01 M to 6 M, more typically from about 0.05 M to 3 M and the concentration of the oxidizer can vary from about 0.2 M and 12 M, more typically from about 1M to about 6 M. Particularly good isotropic behavior is achieved when the oxidizer is used in molar excess with respect to the complexing agent. For example, in some embodiments the oxidizer to complexing agent molar ratio is at least about 2.5:1, such as at least about 3:1, and in some implementations is at least about 5:1.

In the isotropic etching regime, the etch rate strongly depends on the concentration of the complexing agent and to significantly a lesser degree on a concentration of the oxidant. In some embodiments etch rate on the substrate is modulated by modulating the concentration of complexing agent delivered onto the substrate, for example by reducing the concentration of the complexing agent or reducing the flow of the etchant to one or more spray sources.

With respect to pH, typically, higher etch rate is achieved at pH values of between about 5-9, whereas best isotropic behavior (e.g., lower roughness) is achieved between about pH values of 7 and 12. These values, of course, can exhibit slight variation depending on the nature of complexing agent used. When both high etching rates and highly isotropic behavior is important, etching is typically performed at a pH range of between about 7 and 10.5, e.g., between about 8.5 and 9.5.

Because the etching rate typically significantly drops when pH is increased, in some embodiments the etching reaction can be rapidly quenched (e.g., the etch rate can be decreased or etching can be stopped) at high pH. For example, if etching needs to be stopped or slowed, a basic pH adjuster may be supplied into the system to increase the pH of the etchant to, e.g., greater than about 10-12. For example, a solution of TMAH can be added to the etchant to stop the reaction. In one specific embodiment, by utilizing this method to "quench" the etching process, one adds an alkaline agent such as TMAH to one or more chemical streams, and reduces or even completely suppresses the etch rate at that location on the substrate, which comes into contact with this solution.

Examples of suitable etching compositions include but are not limited to aqueous solutions consisting essentially of:
  (a) glycine, hydrogen peroxide and TMAH,
  (b) EDA and hydrogen peroxide;
  (c) EDA and ferric sulfate
  (d) glycine, tetramethylammonium persulfate, and TMAH
  (e) EDA, hydrogen peroxide and acetic acid;
  (f) EDA, hydrogen peroxide and glycine;
  (g) EDA, hydrogen peroxide and sulfuric acid;
  (g) N-methylEDA, hydrogen peroxide and, optionally, an acidic pH adjustor (e.g., aminoacid, sulfuric acid, alkylsulphonic acid, and/or a carboxylic acid);
  (h) Diethylenetriamine, hydrogen peroxide and optionally an acidic pH adjustor (e.g., aminoacid, sulfuric acid, alkylsulphonic acid or a carboxylic acid);
  (i) EDA, glycine, acetic acid, sulfuric acid, and hydrogen peroxide, e.g., with exemplary concentrations of 5.7 mL/L EDA, 4.8 g/L glycine, 0.2 mL/L acetic acid, 0.1 mL/L sulfuric acid, 4 wt % hydrogen peroxide at a pH of about 9.5.

While in many embodiments the solutions may include other materially significant components (for example, a wetting agent), in some embodiments, the etching solutions consist essentially of water, a complexing agent (including multiple complexing agents) selected from the group consisting of aminoacids, diamines, and triamines, an oxidizer (including multiple oxidizers), and, optionally, a pH adjustor (including multiple pH adjustors). These solutions can also optionally include a pH indicator.

Methods of Forming the Wet Etching Compositions

The described wet etching compositions are, in some embodiments, not indefinitely stable at room temperature, and in many embodiments, should be used quickly after preparation. This is particularly significant when hydrogen peroxide is used as an oxidant, since gas evolution and decomposition of the etching solution typically occurs at a relatively fast rate after the etching solution has been prepared. In some embodiments provided compositions are prepared less than about 30 minutes prior to etching, such as less than about 10 minutes prior to etching. In some embodiments, provided compositions are prepared less than about 3 minutes prior to etching, such as less than about 1 minute prior to etching, by mixing the etchant components within the lines of an etching apparatus, and just prior to delivery to the substrate. In some embodiments, the mixed etch formulation is delivered to the substrate after mixing in the lines in less than 15 seconds after mixing.

In some embodiments, the etching compositions are prepared by combining a concentrated solution comprising (or consisting essentially of) water, one or more complexing agents, and one or more pH adjustors, and a solution comprising an oxidizing agent (e.g., hydrogen peroxide) in water. In some embodiments water is further combined with these two solutions for dilution.

In one aspect of the invention, concentrated solutions of complexing agent with a pH adjustor are provided. These solutions can be used to make the provided etching compositions after they are combined (e.g., mixed) with a solution of an oxidant, and, optionally, diluted with water. In one embodiment, such concentrated solution consists essentially of water, one or more of a bidentate diamine, a tridentate triamine, and a quadridentate tetramine, and one or more pH adjustors selected from the group consisting of acids having a first dissociation constant pKa value of less than about 5. In one embodiment, the one or more pH adjustors are selected from the group consisting of sulfuric acid, an alkylsulphonic acid (e.g., methanesulphonic acid), an aminoacid, and a carboxylic acid, wherein the pH of the concentrated solution is between about 8.5 and 11.5 (such as between about 9.5 and 11.5) at 21° C., and wherein concentration of aminogroups derived from the polyamines is at least about 1.5 M (preferably at least about 3 M, in some cases at least about 4 M). The molar concentration of aminogroups is calculated as a molar concentration of a polyamine multiplied by the number of aminogroups in the polyamine. If mixtures of polyamines are used, the concentrations of aminogroups for each polyamine can be added to provide the total concentration. The described concentrated solutions generally have good shelf-lives and can be easily transported.

Table 1 lists examples of various concentrated complexing agent solutions that can be used for preparation of etchants described herein.

TABLE 1

| EDA (mL) | Glycine (g) | Acetic acid (mL) | Sulfuric acid (mL) | Water (mL) | Total volume (mL) | pH at 21° C. |
|---|---|---|---|---|---|---|
| 123.0 | 0.0 | 0 | 45.3 | 832 | 1000 | 9.8 |
| 135.6 | 115.9 | 5.14 | 2.26 | 840 | 1000 | 10.33 |
| 271.2 | 231.8 | 10.28 | 4.52 | 840 | 1170 | 10.45 |
| 125.0 | 128.8 | 0 | 0 | 844 | 1000 | 10.3 |
| 250.0 | 257.6 | 0 | 0 | 844 | 1150 | 10.44 |

TABLE 1-continued

| EDA (mL) | Glycine (g) | Acetic acid (mL) | Sulfuric acid (mL) | Water (mL) | Total volume (mL) | pH at 21° C. |
|---|---|---|---|---|---|---|
| 276.5 | 0.0 | 83.9 | 0 | 639 | 1000 | 10.77 |
| 406.6 | 0.0 | 123.4 | 0 | 470 | 1000 | 11.02 |
| 123.0 | 105.14 | 4.66 | 2.05 | 877 | 1030 | 10.67 |
| 123.0 | 0.0 | 37.3902 | 0 | 839.6 | 1000 | 10.54 |

As it can be seen, in some embodiments, the concentrated solution includes more than one pH adjustor, e.g., it may contain both sulfuric acid, an aminoacid (e.g., glycine), and a carboxylic acid (e.g., acetic acid).

It is understood that in general, the etching solutions can be prepared using a number of mixing sequences, although mixing of pH adjusted complexing agent solution with an oxidizer solution, is preferred in many embodiments. In some embodiments, the mixing sequence is adjusted such that heat generated during mixing of etchant components is used to increase the temperature of the etchant delivered onto the substrate. One or more of the following heat-generating mixing events can be performed or combined shortly prior to etching and the heat generated during mixing could be utilized: dissolution of the complexing agent in water, dissolution of the pH adjustor in water, addition of a pH adjustor to the solution of complexing agent, and mixing of a solution of a complexing agent with a solution of an oxidizing agent.

Table 2 provides examples illustrating change in temperature and the amount of gas released after mixing the oxidizer solution and complexing agent solution components as described herein, and demonstrates the relatively short activity time of the mixtures. 80 mL of a concentrated complexing agent solution containing 18.3%/wt ethylene diamine, 17.4%/wt glycine, 0.8% acetic acid, 0.6% sulfuric acid and 63%/wt water, was mixed with about 1 liter of a 4% solution of hydrogen peroxide in water. Table 2 shows that the temperature rises and the amount of released gas increases rapidly for about the first 3 to 4 minutes after mixing, after which time the solution is spent (decomposed), bubble generation stops, and the solution slowly cools. Confirmation of the formation of a spent solution was obtained by exposing a 0.2 μm thick copper-coated wafer sample to the solution for 1 minute that was mixed 12 minutes previously, showing no appreciable signs of etching. These results and data indicate that in many embodiments, the provided etching solutions should be used for etching shortly after preparation (mixing).

TABLE 2

| Time after Mixing (min) | Temperature (deg Celsius) | Cumulative Amount of Gas Released (Arb Units) |
|---|---|---|
| 0 | 21 | 0 |
| 1 | 25 | 0.2 |
| 2 | 28 | 0.4 |
| 3 | 32 | 0.65 |
| 4 | 35 | 0.85 |
| 5 | 36 | 0.95 |
| 6 | 35 | 0.97 |
| 7 | 34 | 0.99 |
| 8 | 33 | 1 |
| 9 | 32 | 1 |
| 10 | 31 | 1 |
| 11 | 30.5 | 1 |
| 12 | 30 | 1 |

Wet Etching Compositions for Removal of Oxidized Copper Species

It was also discovered that the etching compositions described above in the absence or presence of an oxidizer (e.g., $H_2O_2$) can be used to efficiently remove oxidized copper species (e.g., copper oxides and hydroxides) from the substrate. When the oxidizer is absent, these solutions can be used for selectively dissolving and removing oxidized copper species in the presence of exposed copper metal, e.g., for copper surface cleaning. For example, in one aspect a method of removing oxidized copper species is provided, wherein the method involves contacting a substrate having oxidized copper species residing thereon with an aqueous cleaning solution, wherein the solution comprises a bidentate complexing agent (e.g., EDA and/or aminoacid), a tridentate complexing agent, or a quadridentate complexing agent. In some embodiments polyamines, such as polyethyleneimine are used. Mixtures of complexing agents can also be used. The solution may further optionally include an oxidizing agent and a pH adjustor. The pH of the cleaning solution is typically between about 5 and 12, more typically between about 6 and 10.

In some embodiments, it is preferable not to include an oxidizing agent in the cleaning solutions for removing oxidized copper species.

Suitable solutions include without limitation aqueous solutions consisting essentially of:
(a) glycine and optionally a pH adjustor;
(b) EDA and optionally a pH adjustor;
(c) polyethyleneimine and optionally a pH adjustor;
(d) mixtures of glycine, EDA, and optionally a pH adjustor.

Further, in some embodiments the described cleaning solutions are used for removing a variety of surface contaminants from copper layers. For example in some embodiments a solutions as described above, as well as solutions containing other polyamines such as polyethyleneimine, are used to remove surface-bound organic mercapto compounds (which are typically used as accelerators in copper plating baths and remain in the deposited copper layer) and various plating levelers in the presence of exposed copper with minimal copper removal.

Processes Involving Wet Etching

The wet etching solutions described above can be used to etch (remove) copper-containing metal in a variety of contexts. Copper-containing metal includes without limitation, pure copper metal, copper alloys with other metals, and copper metal impregnated with non-metallic species, such as with organic compounds used during electrofill operations (e.g., levelers, accelerators, suppressors, surface-active agents, etc.). Copper-containing metal in this application will also be referred to as simply "copper".

While etching of copper will be illustrated primarily making reference to processing of a damascene feature, such as a trench, a via (particularly a through silicon via, or "TSV"), a line or a pad, it is understood that provided etching methods can be used in a variety of damascene and non-damascene process flows, where removal of copper is desirable. It is further noted that provided compositions are capable of etching copper selectively in the presence of exposed diffusion barrier materials, such as W, TiW, Ta, $TaN_x$, Ti, $TiN_x$, TiTa, etc.

In one example, provided etching compositions are used to etch copper from copper-filled damascene-features, e.g., lines or vias. Such removal can be performed in the presence or in an absence of exposed diffusion barrier material or exposed dielectric. For example, formation of recesses can be performed in an etching-and-capping application, such as described in the U.S. Pat. No. 7,531,463 issued on May 12, 2009, naming Daniel A. Koos et al. as inventors, previously incorporated by reference, and in U.S. patent application Ser. No. 11/251,353 naming Reid et al. as inventors, filed on Oct. 13, 2005, presently incorporated by reference in its entirety. In the etching-and-capping application, a semiconductor substrate containing a copper-filled damascene feature is provided. The copper-filled feature is typically embedded in a layer of dielectric and is lined with a layer of diffusion barrier material. The substrate is contacted with an isotropic wet etching solution described herein, resulting in a formation of a recess (relative to the upper plane of the substrate which may contain exposed diffusion barrier layer or a layer of dielectric). The exposed metal portion of the recessed feature is typically coated and the recess is at least partially filled in the subsequent operation with a capping material, e.g., by capping metal, e.g., using electrochemical or electroless deposition, PVD, ALD, CVD, or another depositing method.

In another example, the provided copper etching compositions are used for etching copper in order to form a copper pattern from a blanket copper layer residing on a substrate. In this example, a substrate containing a blanket copper layer residing over a layer of dielectric or semiconductor material is first provided. A photoresist film (or any film which can be patterned and does not readily dissolve or etch when exposed to the etch compositions described herein) is then deposited on the blanket copper layer, and is subsequently developed through a mask to generate a desired pattern. The substrate containing developed photoresist is contacted with the provided isotropic etching solution, which removes the unwanted copper in a desired pattern. The photoresist is then removed from a substrate providing a desired pattern of copper conducting paths. This is one illustrative example of the use of the etching solution in a non-damascene context.

The etching compositions provided herein are also very useful for removing copper from globally coated copper regions, and particularly, for partially or completely removing overburdens. An overburden is a layer of metal residing above the plane defined by upper surface of the non-metallic surface of the substrate, e.g., above the dielectric field region. The term "copper overburden" includes all copper residing over the plane defined by dielectric and/or semiconductor and over a diffusion barrier layer (when present). The etching compositions can be used to reduce the thickness of overburden, to planarize the overburden, and/or to completely remove it from the substrate. In some embodiments, the etching compositions and methods are further capable of modulating the thickness of the overburden across the wafer substrate, to obtain a desired profile. For example, depending on a desired profile, a center-thin, a center-thick, or substantially uniform substrate, can be formed after overburden is etched.

The provided wet etching methods can be used either alone, or in combination with other planarization techniques. In some embodiments, wet etching alone is sufficient for planarization. In other embodiments, other planarization techniques, such as CMP or an electroplanarization technique (such as electrochemical chemical mechanical planarization (ECMP), electropolishing, or electrochemical chemical mechanical deposition (ECMD), are performed prior to or after wet etching is performed.

Figure 1B:
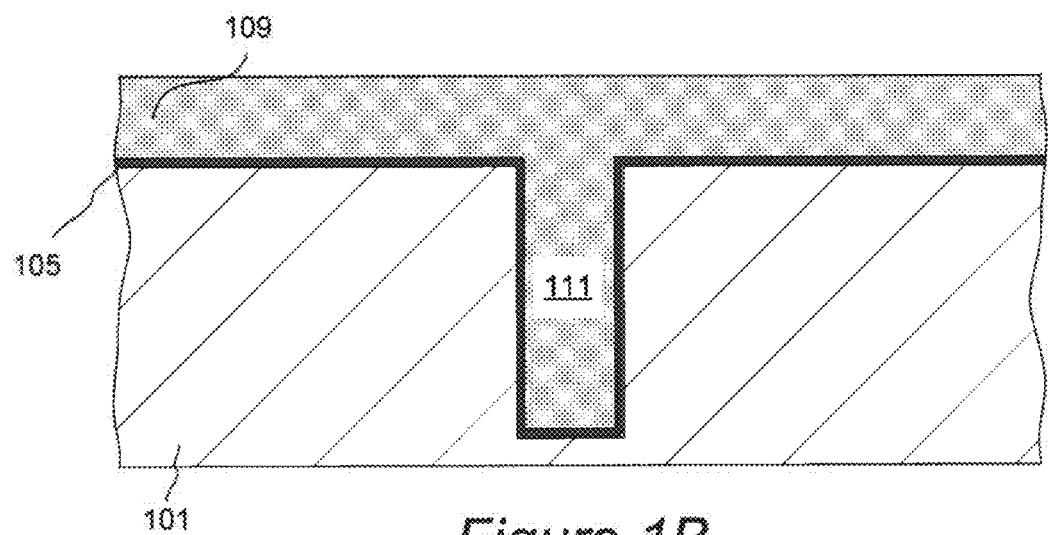
Figure 1C:
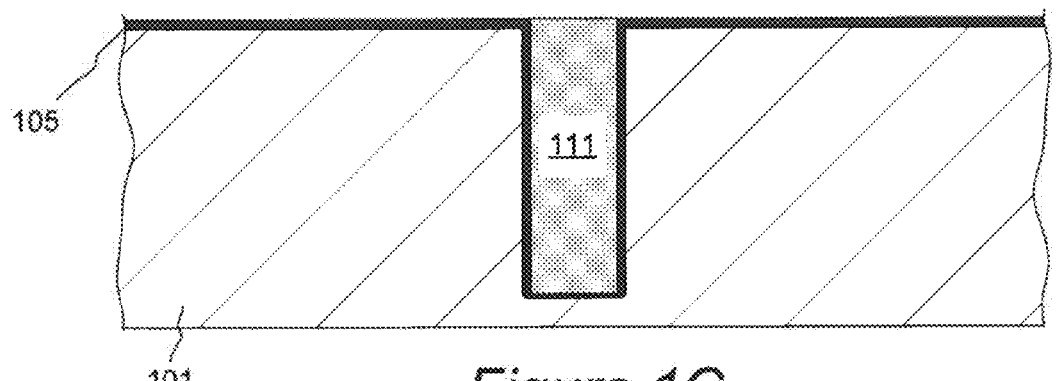

The integration of the isotropic etch into damascene feature processing, will be now illustrated making reference to FIGS. 1A-1C, which show cross-sectional views of a substrate containing a through-silicon via (TSV) during various stages of processing.

A TSV is a vertical electrical connection passing completely through a silicon wafer or a die. TSV technology may be used in 3D packages and 3D integrated circuits, sometimes collectively referred to as 3D stacking. For example, a 3D package may contain two or more integrated circuits (ICs) stacked vertically so that they occupy less space and have shorter communication distances between the various devices than in a 2D layout. Traditionally, stacked ICs are wired together along their edges, but such wiring design can still lead to significant signal transmission time delays, as well as to increases in the stack's dimensions, and usually requires additional redistribution layers to route signals to the periphery of the various ICs. Significantly greater numbers of shorter length, dense interconnections can be made by wiring the IC's directly though the silicon substrate, between each of the vertically stacked ICs. TSVs provide connections through the body of the ICs substrate leading to smaller compact stacks with greatly increased communication bandwidth. Similarly, a 3D single IC may be built by stacking several silicon wafers and interconnecting them vertically through each of the substrates. Such stacks behave as a single device and can have shorter critical electrical paths leading to faster operation. This approach is in many aspects technically superior to traditional peripheral wire-bonding interconnect methodology.

Electronic circuits using TSVs may be bonded in several ways. One method is "wafer-to-wafer", where two or more semiconductor wafers having circuitry are aligned, bonded, and diced into 3D ICs. Each wafer may be thinned before or after bonding. The thinning process includes removal of the wafer material to expose the bottom part of the TSV. TSVs may be formed into the wafers either before bonding or created in the stack after bonding and may pass through the silicon substrates between active layers and an external bond pad. Another method is "die-to-wafer" where only one wafer is diced and then the singled dies are aligned and bonded onto die sites of the second wafer. The third method is "die-to-die" where multiple dies are aligned and bonded. Similar to the first method, thinning and connections may be built at any stage in the last two methods. The integration of the wet etching process into through-silicon via processing is not significantly affected by the sequence in which the through-silicon via is processed.

FIGS. 1A-1C illustrate processing of a TSV prior to wafer thinning, that is, the TSV at these processing stages does not reach all the way through the silicon wafer. A TSV may be used with both dies and wafers, generally referred here as semiconductor substrate 101. Examples of the material suitable for a semiconductor substrate 101 include, but are not limited to silicon, silicon on insulator, silicon on sapphire, and gallium arsenide. In some embodiments, the semiconductor substrate includes a layer of dielectric, such as silicon oxide based dielectric. In other cases the substrate may be more similar to a single level or multilevel circuit board, and can be made of a ceramic or embedded epoxy. Further in some embodiments the substrate may include circuitry or active transistor devices. These features are not shown to preserve clarity.

In a first cross-sectional view shown in FIG. 1A, a hole such as a TSV hole 103 is formed in the semiconductor substrate 101. The depth of the TSV hole 103 must be sufficient to allow for a complete cutting through layer 101 during the subsequent thinning operation. Typically, TSV holes may be between about 5 to 400 microns deep (often between about 50 to 150 microns deep), however the present invention may be practiced with the TSV holes of other sizes as well. The diameter of TSV holes may vary between about 1 to 100 microns (more typically between about 5 to 25 microns). The TSV holes typically have a high aspect ratio, which is defined as the ratio of the TSV hole depth to the TSV hole diameter (usually at the opening). In certain embodiments, the TSV hole aspect ratio may vary between about 2:1 to 12:1 (such as between about 3:1 and 10:1). TSV size also depends on which stage of the overall 3D stacking process includes TSV formation. A TSV can be formed before ("via first") or after ("via last") stacking. In the "via-first" configuration, the TSV may be formed before or after creating CMOS structures. In the "via-last" configuration, the TSV may be formed before or after bonding. Moreover, in both configurations, thinning may be performed before or after bonding. The invention may be practiced with any TSV sizes or forming configurations described herein. Table 3 summarizes typical TSV dimensions (in micrometers) for various TSV configurations. While FIGS. 1A-1C and the corresponding description generally pertains to the configuration where a TSV is formed before stacking and CMOS processing and thinning are performed before bonding ("via-first"+before CMOS+thinning before bonding), this invention can be readily applied to other configurations.

TABLE 3

|  |  | "Via - First" | | "Via - Last" | |
| --- | --- | --- | --- | --- | --- |
|  |  | Before CMOS | After CMOS | Before Bonding | After Bonding |
| Diameter | Thinning Before | 2-5 | 5-20 | 20-50 | 5-50 |
| Depth | Bonding | 30-50 | 40-150 | 50-400 | 30-150 |
| Diameter | Thinning After | 1-5 | 1-5 | 3-5 | 3-5 |
| Depth | Bonding | 5-25 | 5-25 | 5-25 | 5-25 |

TSV holes may be formed using standard photolithographic and etching methods. Returning to FIG. 1A, the TSV hole 103 may be formed through a top surface, which may be an active surface of a wafer or a die and may include electronic devices. Alternatively, the TSV hole may be formed through the back surface of a wafer or a die where the circuitry is not present.

The cross-section in FIG. 1A shows that a layer of diffusion barrier material 105 resides over the substrate 101, and conformally lines the substrate both in the field and within the TSV 103. Suitable materials for the diffusion barrier layer 105 include tantalum, tantalum nitride, tungsten, titanium, ruthenium, titanium nitride, and alloyed and layered combinations of these and other materials. In a typical embodiment, the diffusion barrier layer 105 is formed by a PVD process, although other techniques such as chemical vapor deposition (CVD), electroless deposition, or atomic layer deposition (ALD) may be employed. The seed layer 107 is then deposited to provide a uniform conductive surface for current passage during an electroplating operation. As with the barrier layer deposition, a PVD method may be employed for this operation, although other processes such as electroless or electrolytic deposition may be employed as well. Suitable seed layer materials include metals such as copper, copper alloys, cobalt, nickel, ruthenium, etc. In some embodiments the seed layer can also perform a function of a diffusion barrier. In these embodiments, it may not be necessary to employ a separate diffusion barrier layer 105. Referring again to FIG. 1A, it can be seen that seed layer 107 conformally lines the substrate and resides on top of the diffusion barrier layer 105 both in the field and within the TSV.

The next cross-sectional view in FIG. 1B depicts copper layer 111 as deposited into the TSV hole 103 and over the field region, where it forms an overburden 109, which typically in large feature size 3D packaging (e.g. TSV) application has a thickness ranging from about 4 micrometers to 25 micrometers. For the much smaller feature, device interconnect application, this overburden is thinner, typically 0.5 to 1.5 μm thick. The copper layer is deposited usually by electroplating onto the seed layer 107 (the seed layer is not shown in FIG. 1B to preserve clarity). In a typical electroplating process, the substrate is contacted with the plating solution containing copper ions. Current is then generated through the seed layer 103 causing copper ions to flow towards and deposit on the seed layer. An illustrative electroplating apparatus and a method suitable for TSV filling is described in detail in the commonly owned U.S. patent application Ser. No. 12/193,644, filed on Aug. 18, 2008, titled "Process for Through Silicon Via Filling" naming J. Reid et al. as inventors, which is herein incorporated by reference in its entirety. After electrodeposition of copper, the overburden 109 is removed in a post electroplating process, which includes isotropic wet chemical etching described herein and in some embodiments additionally includes other metal-removal processes, such as CMP and electroplanarization processes. Apparatus and wet etching methods for overburden removal will be described in detail in the subsequent sections.

The next cross-section shown in FIG. 1C illustrates the substrate 101 after post-electroplating processes to remove copper overburden are completed. As shown, the overburden 109 is removed and the diffusion barrier layer 105 is exposed over the field region. In subsequent operations (not shown), the diffusion barrier material is removed from the field region and the substrate is thinned at the TSV bottom, to allow the TSV go entirely through the substrate.

In some embodiments, all of the copper overburden is removed by wet chemical etching and the underlying diffusion barrier is exposed. In one embodiment, the diffusion barrier layer is removed by a selective chemical etching process, which includes contacting the substrate containing exposed diffusion barrier material (e.g. Ta, TaN, Ti, TiN, W, etc.) and exposed metal (e.g., Cu, Co, or Ni) with a wet etching solution that is capable of selectively removing diffusion barrier material in the presence of these metals. Such selective etch leaves the exposed copper (or other metal) in the features significantly unaltered except for, in some cases, the formation of a copper passivation surface layer, which generally is subsequently removed. The wet chemical etching solution for selectively removing the diffusion barrier material (such as tantalum, tantalum nitride, titanium, titanium nitride, tungsten and tungsten nitride) includes, in some embodiments, a hot alkaline solution, such as 25% KOH or tetramethylammonium hydroxide at 70-90° C. Preferably the temperature of hot alkaline solution is at least about 70° C. In an alternative embodiment, a reactive ion etch (a dry process), such as with $SF_6$ or $BF_4$, is used to remove a barrier layer. Such process sequence allows to process a damascene feature without the need for expensive CMP material removal.

In other embodiments, the use of CMP is not completely eliminated but is minimized, by removing at least about 50%, such as at least about 75%, or at least about 90% of the copper overburden thickness by isotropic wet chemical etching described herein, followed by removal of the remaining copper overburden and of an underlying diffusion barrier material by CMP. In other embodiments, copper overburden is completely removed by wet chemical etching, while the remaining diffusion barrier material is removed by CMP.

Isotropic Wet Etching for Planarization

Wet etching compositions provided herein, in some embodiments, are capable of planarizing copper layers having undesirable recessed features, such as pits and dimples. Furthermore, the same compositions provided herein, in some embodiments, are capable of planarizing copper layer having undesirable exposed features, such as mounds or protrusions. Because isotropic etching occurs at substantially similar rates in all directions, a recessed or protruding feature exposed to an isotropic etchant will progressively reduce its aspect ratio, and the substrate containing such recessed feature or protrusion can be substantially planarized, in some embodiments, without resorting to expensive planarization techniques, such as CMP. As mentioned above, the process is generally referred to as an isotropic or "geometric" planarization process, because the rate of metal removal is significantly invariant at all locations on the surface, and continuous etching in this regime erodes the non-planar features geometrically with time. This should be contrasted with anisotropic planarization techniques, such as CMP, electrochemical chemical mechanical polishing, electropolishing, or electrochemical mechanical deposition, each of which removes or deposits metal at rates that are non-uniform. While the non-isotropic planarization methods will typically cause a more rapid smoothing of the surface than an isotropic/geometric process (with respect to amount of metal processed), geometric planarization by wet chemical etching can be performed quickly and economically leading to a significant process advantage, compared to more expensive processes such as CMP.

Figure 2A:
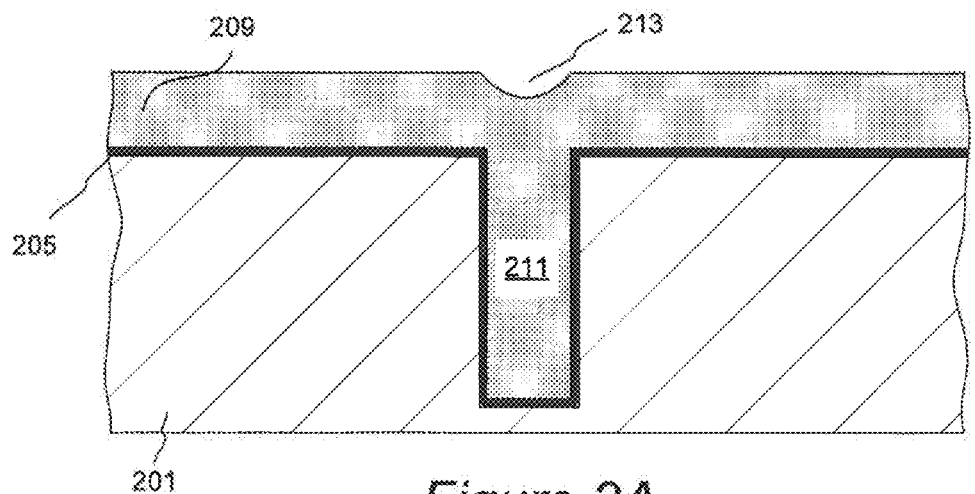
FIGS. 2A-2D illustrate cross sectional views of a damascene structure having a recess in an overburden during planarization of overburden by isotropic etching

The wet etching isotropic/geometric planarization sequence is illustrated in FIGS. 2A-2D which show cross-sectional views of a substrate having a recess 213 in a copper overburden 209, at different stages of processing. The planarization process is illustrated with reference to a partially fabricated copper-filled TSV 211, formed in a semiconductor substrate 201, but is generally applicable to planarization of other uneven copper surfaces. The partially fabricated device shown in FIG. 2A is similar to the device shown in FIG. 1B obtained after electroplating. However, as is shown in FIG. 2A, the device contains a small recessed feature 213 formed in the copper overburden 209, over the copper-filled TSV 211. Such undesired recesses located above the filled damascene feature are often inadvertently obtained after completion of electroplating. In some embodiments, particularly when the recess has relatively low aspect ratio (e.g., 4 to 1 or less, depending on the amount of overburden metal added in the plating step and the tolerance for non-perfect planarization), it is possible to substantially planarize the overburden by isotropic etching alone without using other more involved planarization techniques. In other embodiments, wet etching planarization and other planarization methods (e.g., CMP and electroplanarization) complement one another and are used sequentially. As such, in some cases the sequence may be: an anisotropic planarization process first followed by an isotropic wet etch process (for example CMP, followed by isotropic wet etching), and in other cases, a process of isotropic wet etching may be followed by an anisotropic planarization process (e.g. electropolishing or CMP). Finally, in some embodiments, anisotropic planarization if performed first, followed by isotropic wet etching planarization, and finally finished with a second anisotropic planarization process. A specific example of this sequence is: electrofill, followed by ECMD, followed by isotropic wet etching, followed by a CMP process (or ECMP or electropolishing).

Figure 2B:
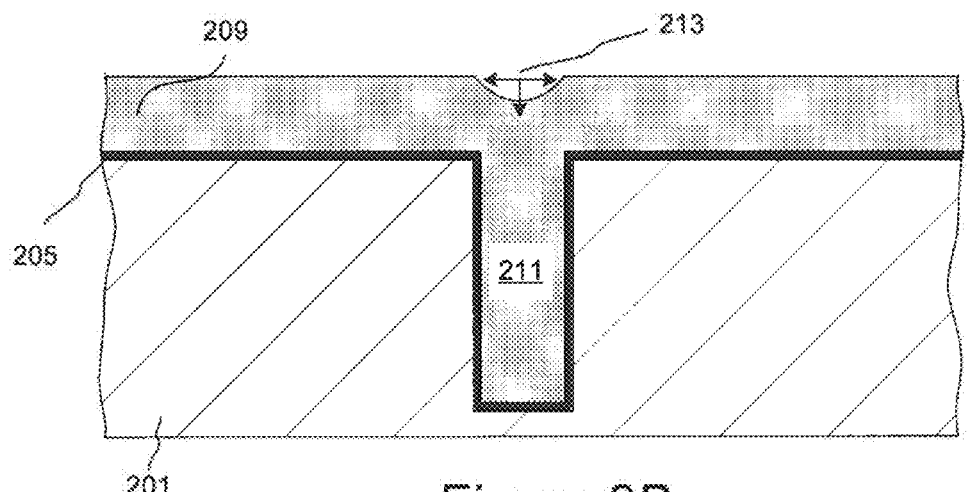
Figure 2C:
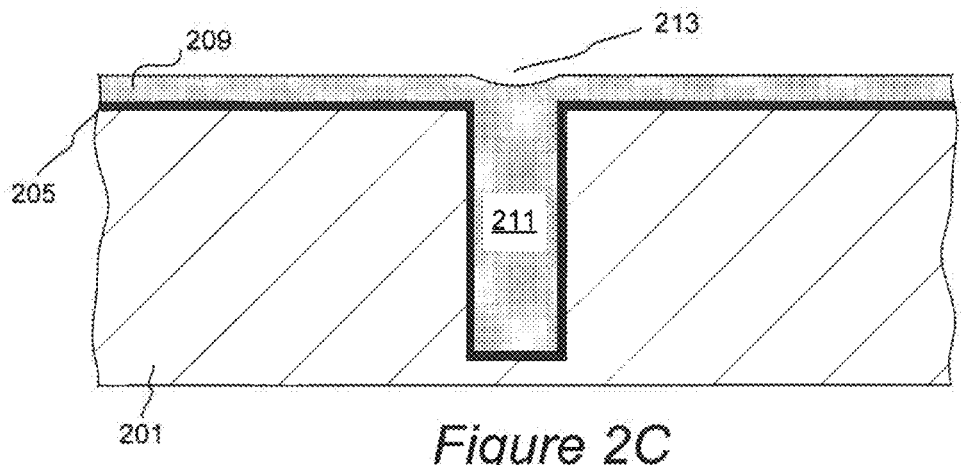
Figure 2D:
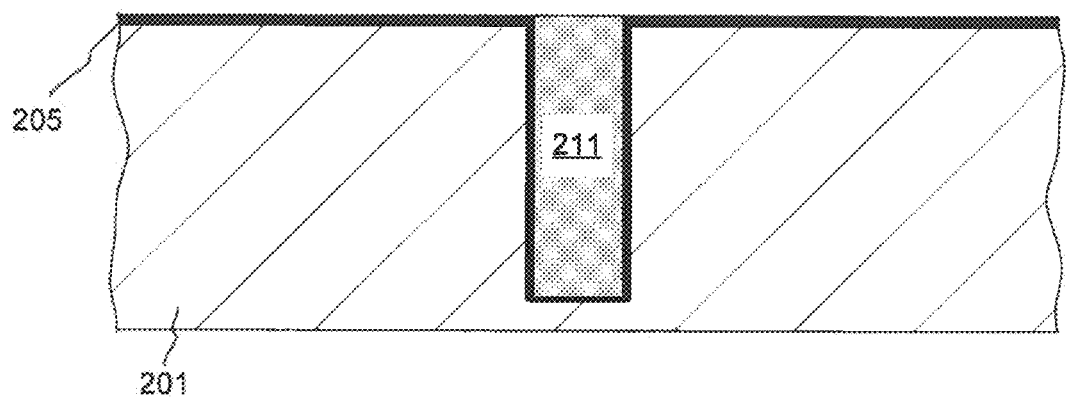

FIG. 2B shows the device cross-section after the copper overburden has been contacted with an isotropic wet etching composition. When the isotropic etchant contacts the recess 213, the etching occurs at substantially similar rates both vertically and horizontally (as shown by arrows). This results in a faster growth of the width of the recess, as compared to its depth. As a result, after the substrate is contacted with a wet etching solution and the etching has been allowed to proceed for a period of time, the aspect ratio of the recess becomes progressively smaller (geometrically leveled or planarized). A cross-sectional depiction of the device structure after isotropic etching was performed for a period of time and the aspect ratio of the recess 213 has been reduced, is shown in FIG. 2C. Next, etching is allowed to proceed further and a planarized device such as shown in FIG. 2D is obtained. The planarized substrate contains exposed diffusion barrier layer 205 and a copper-filled TSV 211 without any recess formation within the TSV. As mentioned previously, the copper overburden need not be completely removed by wet chemical etching, and in some embodiments it is only partially removed and planarized by the isotropic etching.

Isotropic Wet Etching in Combination with Other Planarization Techniques

In some embodiments, as mentioned above, it is practical to use other planarization techniques in combination with isotropic etching. For example, in some embodiments copper layers may contain recesses with aspect ratios that are too high for successful planarization by isotropic etching alone. In these cases additional planarization techniques, such as electroplanarization (e.g., electrochemical removal of unwanted metal or electrochemical deposition into unwanted recesses) and/or CMP may be used. These can be performed prior to or subsequent to isotropic etching, depending on the process needs. One embodiment involving electrodeposition followed by isotropic etching is illustrated with reference to cross-sectional depictions of partially fabricated devices shown in FIGS. 3A-3C and to a process flow shown in FIG. 4.

Figure 4:
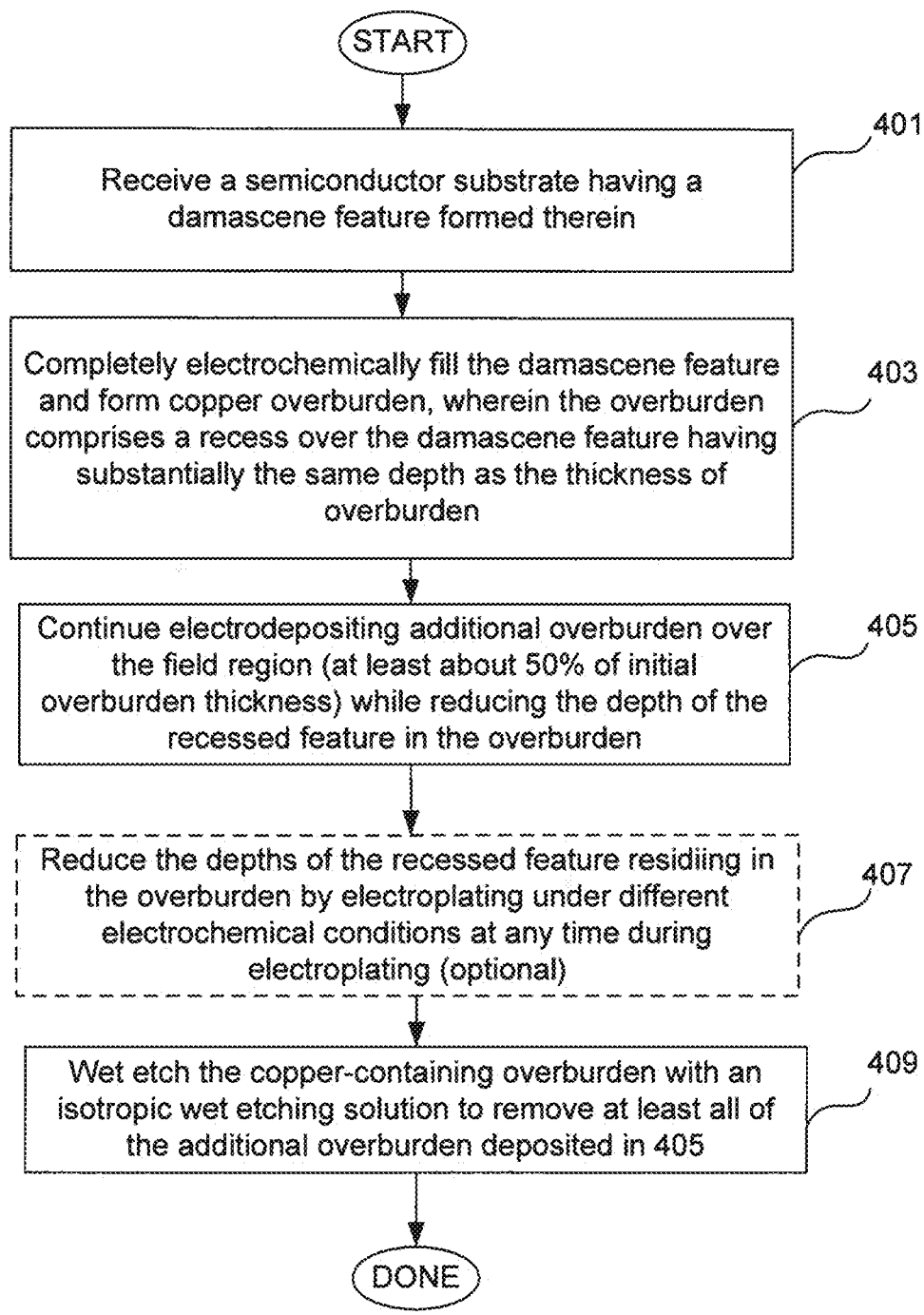
FIG. 4 is a flowchart summarizing processing of a damascene feature in accordance with an embodiment provided herein.

Referring to FIG. 4, the process starts in 401 by receiving a semiconductor substrate having a damascene feature formed therein. In the described example, the feature has a depth of at least about 5 μm, and, in some embodiments, its depth is at least two times greater than its width (at least 2:1 aspect ratio). When such relatively large features are filled with copper, typically a small recess is inadvertently formed directly above the feature (relative to the plane of the overburden). Such recess will be referred to as "the recess in the overburden", although when the feature is not yet completely filled, the depth of the recess is greater than the thickness of the overburden as the recess extends into the partially-filled feature.

Figure 3A:
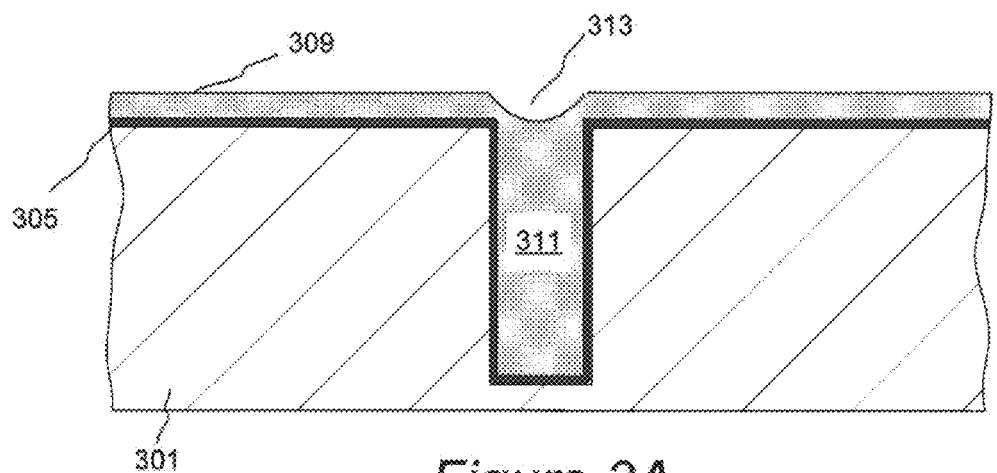
FIGS. 3A-3C illustrate cross sectional views of a damascene structure having a recess in an overburden during planarization of overburden by a combination of electrochemical filling and isotropic etching.

As the electrodeposition proceeds in 403, at a certain point the damascene feature is completely filled with copper, and a copper overburden is formed over the field region. At this point during electroplating the depth of the recess in the overburden is substantially the same as the thickness of the overburden. Typically, the thickness of the overburden at this point is less than about 50% of the damascene feature width. The resulting structure is illustrated in FIG. 3A, where overburden 309 has the same thickness, as the depth of the recess 313 residing over filled via 311.

Figure 3B:
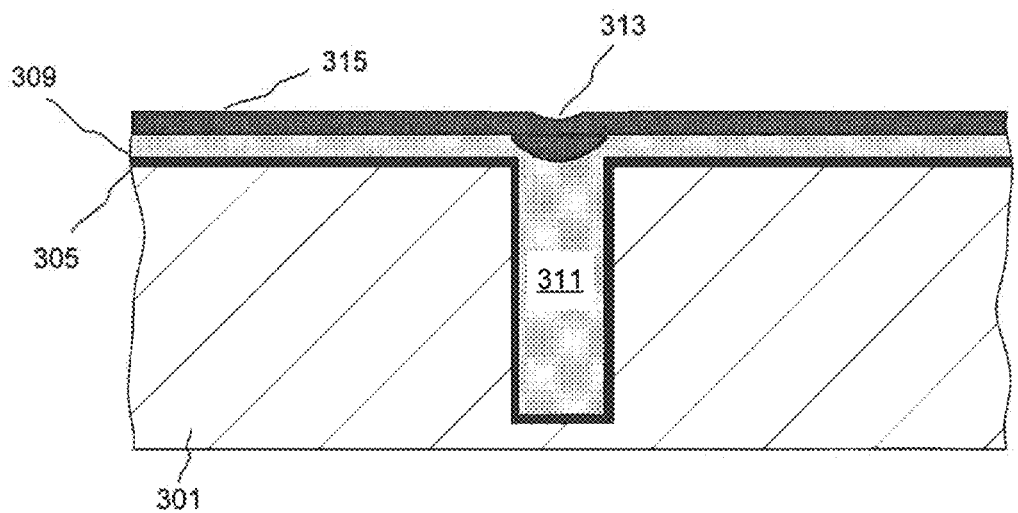
Figure 3C:
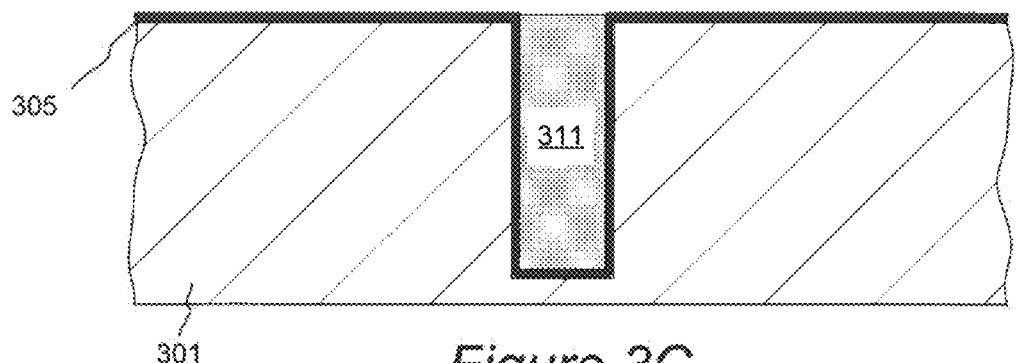

Next, in operation 405 electrodeposition is continued to plate additional copper overburden while substantially reducing the depth (and/or aspect ratio) of the recess over the filled feature. Unlike in a conventional process, which relies heavily on anisotropic metal removal technique such as CMP, the amount of additional overburden material added at this point is typically substantially greater to allow for subsequent planarization via wet chemical etching. Preferably additional copper overburden has a thickness that is at least about 50%, e.g., at least about 100% of initial overburden thickness deposited on the field. The substrate obtained after plating of additional overburden is shown in FIG. 3B, where the thickness of the additional overburden 315 is at least about 100% of the thickness of the initial overburden 309. During additional plating, the depth (and/or aspect ratio) of the recessed feature 313 residing over the filled via 311 is substantially reduced, thereby contributing to planarization of the substrate. It is understood that the initial overburden 305 and additional overburden 315 typically have similar or identical compositions.

At some point during electroplating (e.g., during plating of initial overburden layer 309, or during plating of additional overburden layer 315), the electroplating conditions can be optionally changed (either abruptly or gradually) in order to configure the conditions to reduce the depth of the recessed feature residing in the overburden, as recited in operation 407. In some embodiments, the conditions are changed, while the damascene feature is not yet completely filled, and the depth of the recess in the overburden is still greater than the thickness of the overburden (before the completely filled structure shown in FIG. 3A is formed). In other embodiments the conditions can be changed when the depth of the recess in the overburden is equal to or is smaller than the thickness of the overburden (after the completely filled structure shown in FIG. 3A has been formed)

The initial electrodeposition conditions are typically adapted for filling of the damascene feature, and are then changed, in some embodiments, to be adapted for reducing the depth of the recess in the overburden. This change may include changes directed at increasing the thickness of the mass transfer boundary layer (e.g., reducing rotation rate of the substrate), increasing the rate of incorporation of a leveler compound into the plated layer (e.g., by increasing the current density), or, for example, at decreasing the concentration of a leveler compound in the plating bath by changing the plating bath chemistry.

During electroplating, the damascene feature is at least partially filled by contacting the substrate (the substrate in many cases rotating in the plating bath) with a plating solution contained in a plating bath, wherein the substrate is electrically biased and is serving as a cathode of the plating system. A power supply providing appropriate levels of current to the cathode is electrically connected to the cathode substrate and to an anode. The anode is electrically (though the electrolyte and power supply) connected to the substrate, and typically resides in the same plating vessel, and is, in some embodiments, separated from the cathodic portion of plating solution by an ionically permeable membrane. The plating solution contacting the substrate typically comprises a copper salt, an acid, and one or more of additives, such as de-foaming agents, levelers, suppressors, accelerators, wetting and surface active agents, etc.

In one implementation, the change in electroplating conditions comprises increasing the current density provided to the substrate. For example, current density can be increased from between about 1-5 mA/cm$^2$ (during a first plating period) to between about 5-50 mA/cm$^2$ (during subsequent plating period) in order to reduce the depth of the recess residing over the damascene feature. In another implementation, the change in electroplating conditions comprises decreasing the rotation rate of the substrate or changing a convective condition to similarly affect the mass transfer boundary layer. For example, rotation rate can be decreased from between about 30-240 rpm, e.g., from a rate of between about 30 to 120 rpm (during a first plating period) to between about 5-30 rpm (during subsequent plating period) in order to reduce the depth of the recess residing over the damascene feature. In yet another implementation, the chemistry of the plating bath is changed in order to effect preferential filling of the recessed feature in the overburden. In some embodiments, a combination of current increase and wafer rotation rate decrease are used. In some embodiments, any of these changes is combined with a change of the plating bath. In more general terms the change in conditions is directed, in some embodiments, at increasing the thickness of the mass transfer boundary layer, which can be effected by decreasing the rotation rate of the substrate. In some embodiments, the thickness of the mass transfer boundary layer is increased by a factor of 1.4, preferably by a factor of 2. Lower convection, associated with a thicker boundary layer thickness or a lower rotation speed of the substrate, can lead to diminished transport of, for example, surface-overpotential-generating plating leveling compounds, and the reduction in the supply to the surface may allow for improved bottom up filling interactions of other additives (e.g. interactions between accelerator and suppressor molecules) to create or accelerate anti-conformal bottom-up filling processes. Such a modification of transport condition results in preferential filling within the recessed feature (e.g. bottom up fill), and can similarly lead to a more planarized substrate.

In some cases, the entire electrodeposition is performed in the same plating bath and cell. In another embodiment, the substrate is removed from a first cell where filling occurs primarily in the first plating bath, is then optionally rinsed, and then transferred to a second plating cell with a different plating bath.

In one implementation, the substrate may be brought into contact with a different plating solution, after at least partial electrofill of the damascene feature is completed. In one example, the substrate is subjected to electroplating while contacting a plating bath chemistry having a first composition, wherein the composition is configured for electrofill of a recessed damascene feature (e.g., a TSV). Next, the substrate may be transferred to a plating bath of a second composition (or the plating bath contacting the substrate may be changed to a different chemistry), wherein the second composition is configured for preferential filling of recessed features in the overburden. For example, the first bath may comprise one or more of a) a relatively high concentration copper ion (e.g. greater than about 50 gm $Cu^{++}$/liter) at b) a relatively higher temperature (e.g. greater than about 30° C.) and c) a relatively higher concentration of a highly suppressing and/or highly chemically active leveler compound (e.g. greater than about 10 ppm of polyvinylpyrole) with d) relatively lower concentrations of one or more accelerator (e.g. less than about 5 ppm of dimercaptopropane sulphonic acid), suppressor (e.g. less than about 100 ppm of a 2000 MW polyethylene glycol), and specifically adsorbing halides (e.g. less than about 35 ppm chloride) components. Conversely, the second bath may comprise one or more of a) a relatively lower concentration of copper ion (e.g. less than about 40 gm $Cu^{++}$/liter) operated at b) a relatively lower temperature (less than about 25° C.) and c) a relatively lower concentration of the same or less suppressing and/or less chemically-active leveler (e.g. less than about 10 ppm of polyvinylpyrole) with, d) a relatively higher concentration of one or more of accelerator (e.g. greater than 5 ppm of dimercaptopropane sulphonic acid), suppressor (greater than 100 ppm of a 10000 MW polyethylene glycol), and specifically adsorbing halides (e.g. greater than 30 ppm chloride ion) components. In some embodiments in the second plating bath configured for reducing the depths of recesses in the overburden, the substrate is rotated at a lower speed and/or higher level of current is supplied to the substrate, than in the first plating bath which is configured for at least partially filling the recessed damascene feature.

It is understood that the methods provided above can be used in various combinations, and need not necessarily completely fill the recessed features residing in the overburden, such that a planarized substrate is obtained. In many embodiments, the depths of the recessed features are reduced, but the features are not completely planarized. In other embodiments the recessed feature is filled completely, and in some cases a protrusion or a mound at the site of the recessed feature may form. Moreover, in some embodiments, it is not necessary to change electroplating conditions in order reduce the depths of recessed features in the overburden, as it may be sufficient to continue electroplating under the same conditions used for filling of the damascene feature.

Referring back to the process flow diagram shown in FIG. 4, in operation 409, after the additional overburden has been deposited (with or without a change in electroplating conditions), the overburden is etched with an isotropic wet etching solution provided herein. Preferably, in this step all of the additional overburden material deposited in operation 405 is etched away. In some embodiments at least about 50% of total overburden thickness (deposited in operations 403 and 405) is removed. For example at least about 75%, such as at least about 90% of total overburden thickness are removed. In some embodiments the copper overburden is substantially completely removed by wet chemical etching. Because of the isotropic nature of provided chemical etch, the depth and/or aspect ratio of the recessed feature will typically be further reduced during the etching process, thereby contributing to the overall planarization process. Accordingly, the process essentially provides a method of planarizing the substrate by a combination of planarizing electrodeposition and planarizing isotropic wet etching.

When copper overburden is removed only partially by wet chemical etching, the remaining overburden is removed by other techniques, such as CMP, ECMP, electropolishing and the like. In a specific illustration of a discussed process sequence, a TSV having a depth of about 100 μm is completely filled with copper by electroplating, such that a 5 μm thick copper overburden is formed over the field region, and a 5 μm deep recess is inadvertently formed in the overburden directly above the filled via. Shortly before the TSV is filled (while the recess bottom was below the plane of the field), the electrodeposition conditions are changed to increase the current density provided to the substrate and to reduce the substrate rotation rate in order to effect planarization of the recessed feature in the overburden. After the depth of the recess becomes the same as the thickness of the overburden (or, in other words, the bottom of the recess is at the same level as the plane of the field), the electrodeposition continues to plate about 5 μm of additional overburden material on the field region, while reducing the depth of the recess in the overburden. The substrate is then transferred into a wet etching apparatus, and about 6 μm of copper overburden are removed, leaving about 4 μm of copper overburden on the substrate. Next, the substrate is transferred to the CMP apparatus, and the remaining copper overburden is removed by CMP followed by CMP removal by the diffusion barrier layer.

In other embodiments, diffusion barrier layer is removed by a selective wet etching process described above.

Implementation of Wet Etching Process

In general, wet etching with isotropic etching solutions provided herein can be accomplished in a number of ways including by spraying the etchant from one or more spray nozzles, delivering the etchant from jet nozzles, delivering the etchant from a showerhead, etching in a thin film reactor or by a spin on contact method. In some embodiments the substrate can be simply immersed into the etchant, preferably with some form of solution agitation.

In many embodiments, however it is preferable to spray the etching solution onto rotating substrate using two or more spray sources (e.g., nozzles) adapted for delivering the isotropic wet etching solution to spacially distinct regions of the substrate at the time of impact, in order to achieve localized etching control. Further, in some embodiments, a number of parameters for individual nozzles can be independently controlled, to allow for precise control of etching uniformity. For example, one or more of the following parameters can be controlled: (i) nozzle position with respect to the wafer (including the angle at which the spray is delivered onto the substrate); (ii) time of etchant delivery (including total time of etchant delivery for each nozzle, as well as timing of starting and ceasing the etchant delivery from each nozzle); (iii) composition of etchant delivered from the nozzles; (iv) flow (e.g., flow rate and timing) of quenching solution delivered from at least one nozzle; (v) flow rate of the etchant from the nozzles; (vi) concentration of at least one component in the etchant delivered from the nozzles; and (vii) shape of flow pattern delivered from the nozzles. In some embodiments, one or more of these parameters are controlled during the time of etching (although the parameter may be the same for all nozzles). In other embodiments the parameters can be controlled individually for each nozzle and may be time-invariant. In other embodiments, one or more parameters can be controlled individually for each nozzle as well as in time during the course of etching. For example, all nozzles may start delivering the etchant of the same composition onto the wafer substrate at the same time. As the etching progresses, in some nozzles the etchant may be diluted, or the quenchant may be added to reduce the local etch rates. Further, different nozzles may deliver the etchant for different periods of time. In other embodiments, the angle of incidence of the spray delivered from each nozzle, may be individually modulated for each nozzle during the course of etching.

The suitable apparatus containing multiple spray nozzles which allow for modulation of parameters is described in detail in the co-owned U.S. Pat. No. 8,530,359 issued on Sep. 10, 2013 which is herein incorporated by reference in its entirety for its disclosure of wet etching apparatus and methods.

Figure 5:
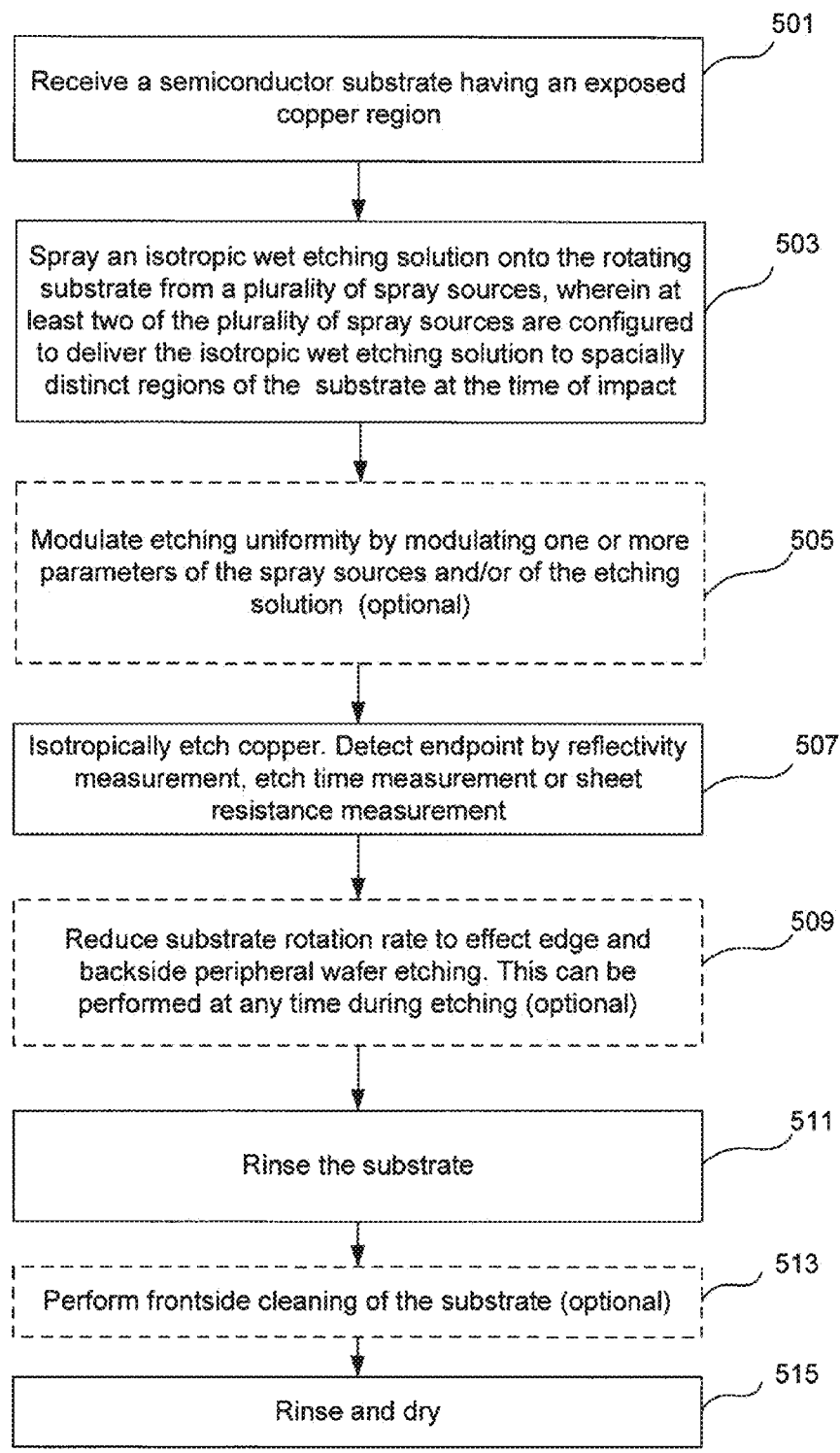
FIG. 5 is a flowchart providing an exemplary process flow for wet etching in accordance with an embodiment provided herein.
Figure 8:
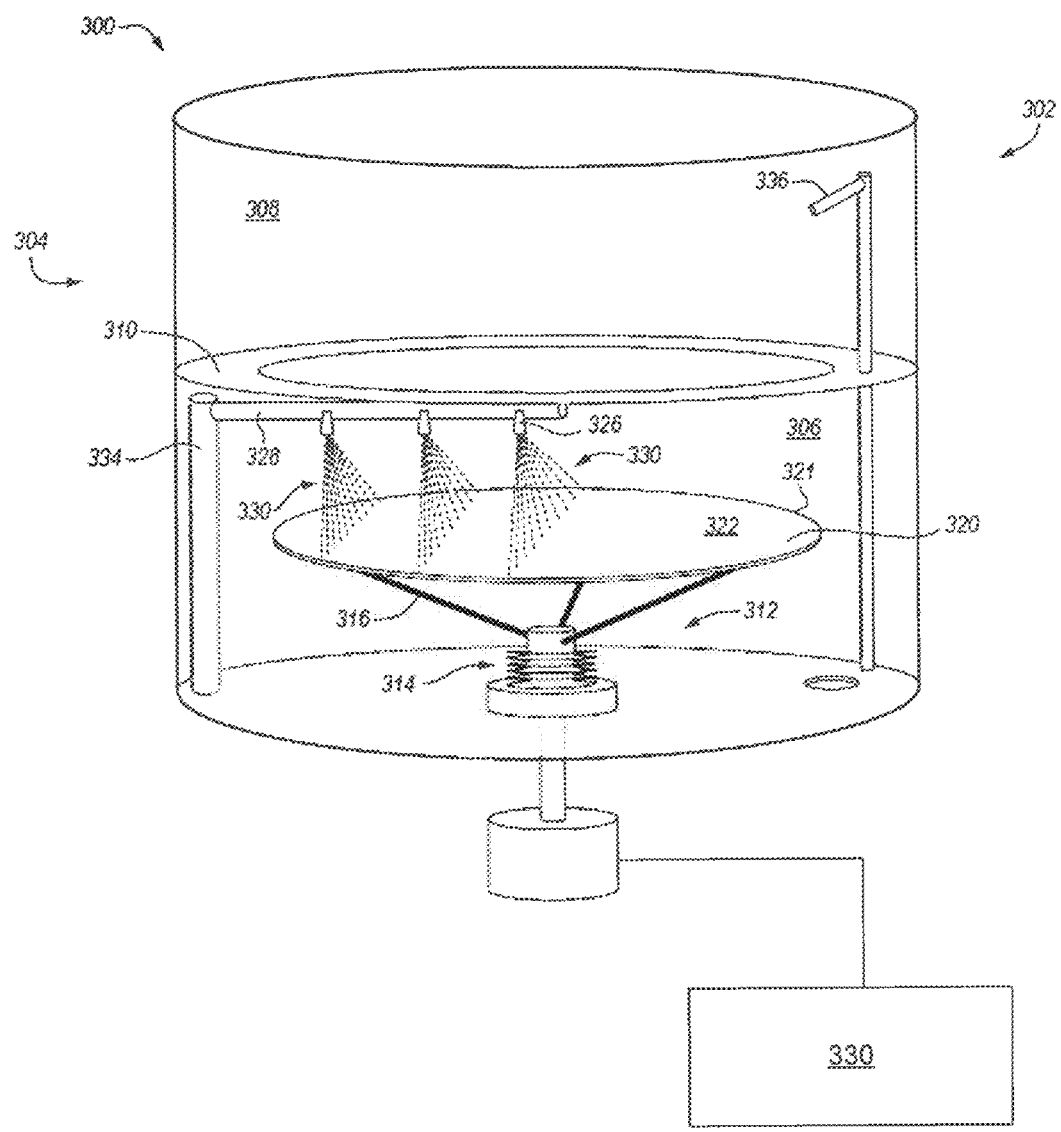
FIG. 8 is a view of an apparatus configured for performing wet chemical etching in accordance with an embodiment provided herein.

A process flow diagram for an exemplary wet chemical etching process is described in FIG. 5. The process starts in operation 501, where a semiconductor substrate having an exposed copper region is received. The substrate may be received pre-wetted, or may be wetted in the wet etching apparatus. The substrate is placed on a pedestal, and is rotated at a rotation speed of between about 100-500 rpm, such as between about 150-300 rpm. In some embodiments, the pedestal for holding the substrate has a relatively small contact area with the backside of the substrate, to allow for a substantially unimpeded flow of etchant at the peripheral region of the backside of the substrate. Specifically, in some embodiments, the peripheral region of the wafer backside (e.g., at least about 0.5 cm from the edge, preferably at least about 2.5 cm from the edge, such as up to about 5 cm from the edge of the wafer) is not in contact with the pedestal. Such pedestal is described, for example, in the co-owned U.S. Pat. No. 8,530, 359 issued on Sep. 10, 2013, previously incorporated by reference, and is also shown in FIG. 8 as the collection of wafer-supporting support arms 316.

Next, while the substrate is rotating, in operation 503, a wet etching solution is sprayed onto the rotating substrate from a plurality of spray sources, wherein at least two of the plurality of the spray sources are configured to deliver the isotropic wet etching solution to spacially distinct regions of the substrate at the time of impact and to provide for controlled localized etching. In one embodiment, wet etching comprises rotating a semiconductor wafer in a wafer holder; applying a first flow pattern of etching liquid to a first band-like impact zone of the rotating semiconductor wafer using a first etch nozzle during at least a portion of a total etching time; and, simultaneously applying a second flow pattern of etching liquid to a second band-like impact zone using a second etch nozzle during at least a portion of the total etching time. The first impact zone and the second impact zone are spatially distinct from each other, meaning they do not overlap, or at least do not overlap significantly.

In some embodiments, as shown in operation 505, the etching uniformity is modulated by modulating one or more parameters of the spray sources and/or of the etching solution. For example in one embodiment, a first cumulative etching rate in a first local etch region of the semiconductor wafer is selectively controlled relative to a second cumulative etching rate in a second local etch region by modulating the first flow pattern of etching liquid. It is understood that the different cumulative etching rates in two or more different local etch regions may be influenced by flow patterns of etching liquid generated by two or more etch nozzles. In some embodiments, only one flow pattern is modulated to influence and to control cumulative etching rates. In some embodiments, two or more flow patterns are modulated either simultaneously or sequentially during a total etching time to control cumulative etching rates in two or more local etch regions. In some embodiments modulating the flow pattern includes modulating at least one parameter selected from the group consisting of (i) nozzle position with respect to the wafer; (ii) time of etchant delivery; (iii) composition of etchant delivered from the nozzles; (iv) flow of quenching solution delivered from at least one nozzle; (v) flow rate of the etchant from the nozzles; (vi) concentration of at least one component in the etchant delivered from the nozzles; and (vii) shape of flow pattern delivered from the nozzles. In some embodiments, the first etch nozzle modulates the first flow pattern of etching liquid through one or a combination of the following techniques: by cessation of etching liquid flow; by ceasing flow of etching liquid and then applying deionized water to the first impact zone; by ceasing flow of etching liquid and then applying an etching quenchant to the first impact zone; by changing a flow rate of etching liquid; by changing a composition of etching liquid; by changing a concentration of etching liquid; and, by changing a shape of the first flow pattern.

The isotropic wet etching is performed for as long as necessary, as shown in operation 507. Endpoint of etching can be detected by a number of methods. In some embodiments, sheet resistance of the etched metal layer is measured, and the etching is stopped after the sheet resistance increases to a certain threshold level. In other embodiments, for etching compositions having known etch rates, the etching can be simply terminated after a required period of time has passed, wherein the time can be correlated to the thickness of the etched layer. In other embodiments, endpoint may be detected by measuring reflectivity of substrate surface during etching, such that etching can be stopped after a certain threshold reflectivity value has been measured.

In some embodiments, at any time during etching (in the beginning of the process, in the middle, or at the end), the substrate me be rotated at a lower rotation rate, to allow the etching solution to spread to the edge of the substrate, and to the peripheral region of the backside of the wafer (e.g., within at least about 0.5 cm from the edge, preferably within at least about 2.5 cm from the edge, such as within at least about 5 cm from the edge). As recited in operation 509, this will effect removal of copper from edge region of the substrate, and from peripheral backside region of the substrate, when it is desirable to do so. Typically the rotation rate of the substrate during removal of edge and backside material is significantly lower than during bulk etching, e.g., is between below about 150 rpm.

Next, after the etching operation is completed, the substrate is rinsed in operation 511 to remove the etching solution from its surface. Rinsing can be performed in a separate chamber, or in the same chamber as etching, as is described in detail in the co-owned U.S. Pat. No. 8,530,359 issued on Sep. 10, 2013, previously incorporated by reference. In one embodiment rinsing is performed by delivering rinsing fluid (e.g., DI water) from a dedicated rinse nozzle located in the wet etching apparatus.

Optionally, as shown in operation 513, after the etching is completed, a frontside cleaning operation is performed. Frontside cleaning is usually performed to remove oxidized copper species and other contaminants from the front side of the substrate. In some embodiments, it is performed by contacting the substrate with a dilute acid solution. In other embodiments, it may be desirable to perform front side cleaning by contacting the substrate with neutral or basic cleaning solution provided herein, e.g., with an aqueous glycine solution and/or aqueous ethylenediamine solution at a pH of between about 5-12. For example, in some embodiments, the frontside cleaning solution consists essentially of a bidentate, a tridentate or a quadridentate complexing agent in water with an optional addition of a pH adjustor.

Finally, after optional frontside cleaning is completed, the substrate is rinsed and dried as shown in operation 515, and is then directed for further processing (e.g., to a CMP, or electroplanarization apparatus, or to a chamber adapted for wet etching of diffusion barrier).

Implementation of Wet Etching Using in an Apparatus Equipped with a Moveable Arm Carrying Etch Nozzles In one embodiment the wet etching apparatus includes a moveable arm carrying a plurality of etch nozzles connected with supplies of requisite etching chemistries (and, optionally, other chemistries or water), and a typically stationary rinse nozzle adapted for delivery of a rinsing liquid (typically DI water, or a buffered aqueous solution).

Figure 6:
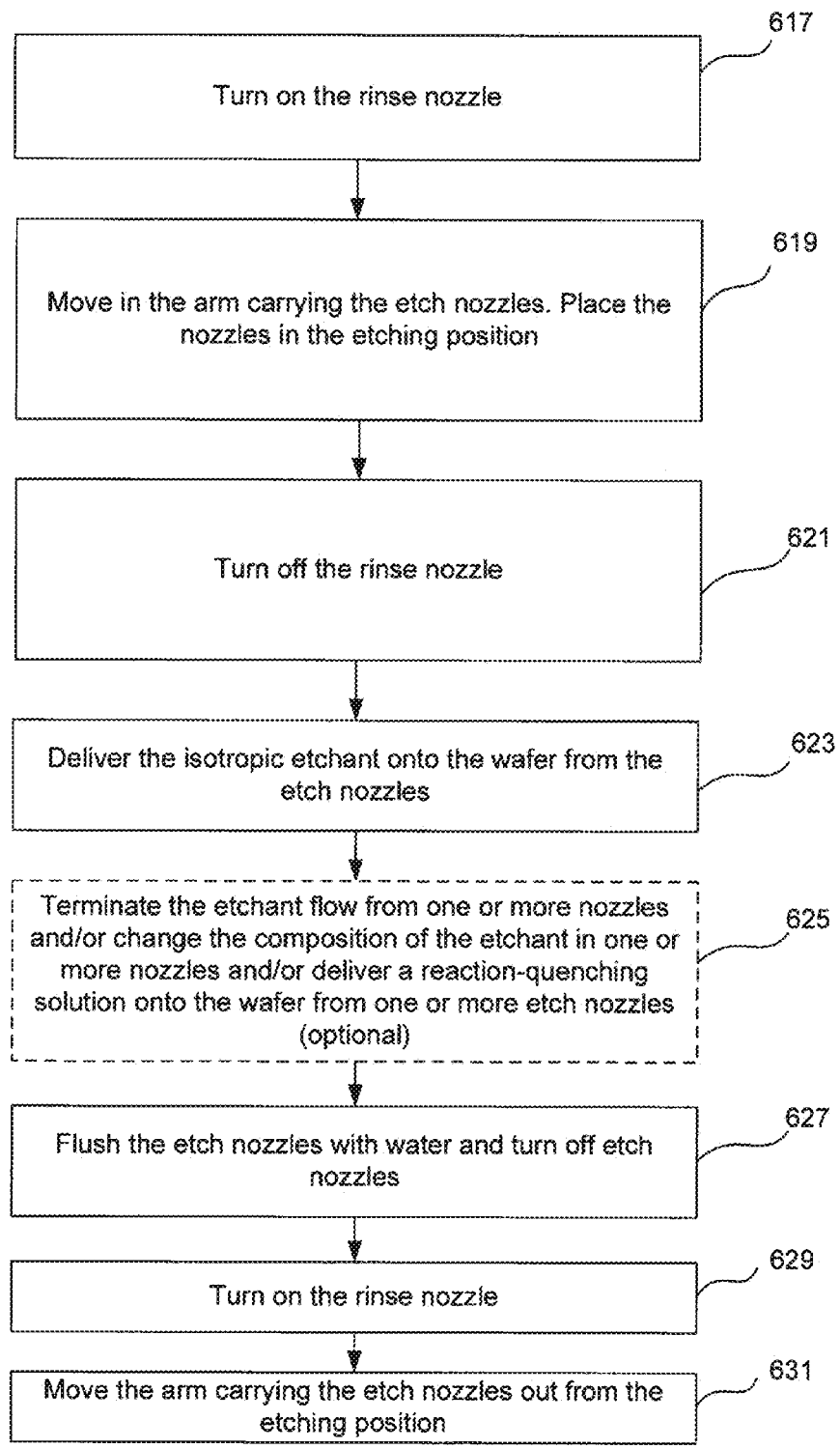
FIG. 6 is a flowchart summarizing a process for wet chemical etching in accordance with an embodiment provided herein.

Because contact of the etchant with the substrate needs to be precisely controlled to achieve desired uniformity, care should be taken to avoid inadvertent spraying of etchant onto the substrate, particularly at the very beginning or at the very end of etching. An exemplary process sequence, in which the substrate is substantially protected from such inadvertent splashes of etchant is illustrated in FIG. 6.

In the beginning of the process the substrate resides on the pedestal in the etching chamber, while the arm carrying the etch nozzles is not in the etching position. Specifically, the arm is removed from above the wafer face, e.g., to a dedicated alcove, such that in this position any inadvertent spraying of the etchant from the nozzles would not impact the wafer. In the beginning of the process, as shown in FIG. 617 a rinse nozzle is turned on to deliver the rinsing liquid. While the rinse nozzle is still on, the arm containing the etch nozzles is brought into the etching position (typically disposing the nozzles above the wafer) in operation 619. Optionally, a non-etching rinsing fluid may flowed through the etch nozzles prior to moving the arm over the substrate. Next, in operation 621, the rinse nozzle is turned off, and in operation 623 the isotropic wet etchant is delivered onto the substrate from the etch nozzles, to effect the etching. In many embodiments, the composition of the etchant delivered to each nozzle at the beginning of the process is identical. Next, in operation 625 which is optional and is used for modulation of etching uniformity, the etchant flow from one or more etch nozzles is terminated and/or the composition of the etchant in one or more etch nozzles is changed and/or a reaction quenching solution is delivered to one or more nozzles. Such modulation allows for speeding or slowing down the etching reaction in the desired locations of the substrate. After the desired amount of etching is performed, the etch nozzles are flushed with a rinsing fluid (e.g., water) and are turned off as shown in operation 627. Next, or concurrently with etch nozzle flushing 627, a rinse nozzle is turned on, delivering the rinsing liquid. While the rinse nozzle is on, the arm carrying the etch nozzles is removed from the etching position, in operation 631. Next rinsing liquid is turned off both for the rinsing nozzle and for the etch nozzle (if applicable), and the substrate after etching is ready for subsequent processing.

Apparatus

Figure 7:
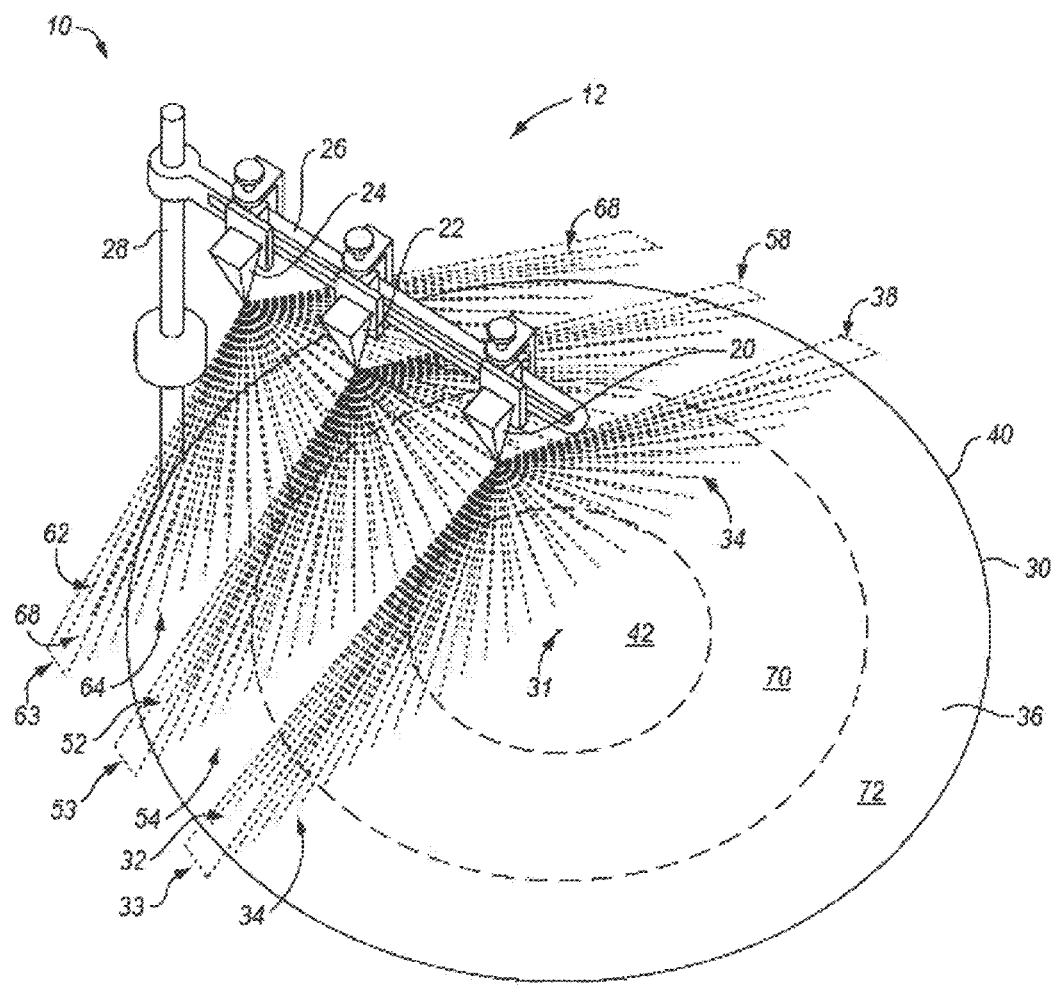
FIG. 7 is a schematic perspective view of a simplified system for performing localized etching of metal from a semiconductor substrate in accordance with an embodiment provided herein.

As it was mentioned, generally, wet etching of copper-containing metal can be performed in a variety of types of apparatus. An exemplary apparatus, which utilizes two or more spray nozzles, which are, in some embodiments, are separately controllable, will be described. Such apparatus provides improved control over the uniformity of etching at different locations of the wafer, allowing control over etching reaction rates at different locations of the wafer. FIG. 7 depicts schematically a perspective view 10 of a simplified system 12 in accordance with the invention for performing localized etching of metal from the surface of semiconductor wafer. System 12 includes three liquid spray nozzles: a center nozzle 20, a middle nozzle 22, and an edge nozzle 24. In this figure, the nozzles are shown as "wide angle fan nozzles" or "flat spray nozzles", that is, each nozzle creates a flow pattern in the shape of a wide triangle with a narrow width, the spray emanating from a small specially shaped nozzle orifice to create the flow pattern depicted. Suitable exemplary nozzles are commercially available from Spraying Systems Inc. of Wheaton, Ill. (e.g., VEEJET® series nozzles), and Lechler Corp. of St. Charles, Ill. Nozzles 20, 22 and 24 are supported on a substantially horizontal nozzle arm 26, which is connected to a vertical shaft 28. As depicted in FIG. 7, spray nozzles 20, 22, 24 are aligned substantially linearly above and substantially parallel to a radius of a rotating semiconductor wafer 30, which has a wafer center 31. Each of nozzles 20, 22, 24 is operable to apply etching liquid in a desired spray or other type of flow pattern to a selected impact zone of wafer 30 at a selected desired liquid flow rate and, in some embodiments, at a desired, adjustable angle of incidence to the wafer. In the embodiment depicted in FIG. 7, nozzle 20 generates a fan-shaped spray pattern 32 of etching liquid. Each of these "wide angle fan nozzles", sometimes referred to as "flat spray nozzles", or V-shaped spray nozzles, creates a flow pattern in the shape of a wide triangle having a narrow width, the spray emanating from a small specially shaped nozzle orifice to create the flow pattern, as depicted. Typical flow rates for each of the individual nozzles range from about 50 to 500 ml/min. In some preferred embodiments, fan-shaped spray pattern 32 (or other flow pattern) has a finite width 33, typically in the range of about from 5 mm to 20 mm. Accordingly, in some preferred embodiments, spray pattern 32 is essentially 3-dimensional (3-D) and, therefore, forms a band-like pattern of etching liquid as it impacts wafer 30 (in contrast to an essentially one-dimensional (e.g., linear) impact zone that a 2-dimensional spray pattern might form). Spray 32 impacts wafer 30 in an impact zone 34 that extends substantially straight across top wafer surface 36 parallel to a wafer diameter, corresponding to a wide (band-like) chord of the circle formed by peripheral edge of wafer 40. Impact zone 34 has a finite width corresponding to width 33 of spray pattern 32. Accordingly, in some preferred embodiments, impact zone 34 has the form of a band having a width corresponding to width 33 of spray pattern 32; an exemplary width of impact zone 34 is in a range of about from 5 mm to 20 mm. As depicted in FIG. 7, impact zone 34 extends across wafer 30 as a band having a substantially rectangular shape with a length corresponding to the length of a chord across wafer 30 and a width corresponding to width 33. As depicted in FIG. 7, the trajectory of fan-shaped 3-D liquid spray 32 includes a peripheral portion 38 that extends beyond peripheral edge 40 of semiconductor wafer 30. A peripheral portion 38 of a liquid flow pattern in accordance with the invention is not always necessary, but is sometimes useful to ensure full development of a desired flow pattern as well as to facilitate etch process uniformity control. A peripheral portion 38 of the liquid flow pattern is also sometimes useful to ensure sufficient wetting (when desired) with etching liquid of the peripheral edge 40 of semiconductor wafer 30. A peripheral portion 38 of the liquid flow pattern is also sometimes useful to ensure sufficient wetting (when desired) by etching liquid of a peripheral region on the backside (not shown) of wafer 30 near peripheral edge 40. When semiconductor wafer 30 is rotating in accordance with the invention, fan-shaped spray 32 results in substantially complete wetting of wafer surface 36. In exemplary embodiments, semiconductor wafer 30 is rotated at a moderate speed in a range of about from 100 rotations per minute (rpm) to 500 rpm during etching, more specifically from about 150 to 300 rpm, for example 250 rpm. Excessively high speeds (e.g., greater than 500 rpm) should generally be avoided as they cause excessive fluid splashing and misting, significantly reduce the average fluid surface residence time, and are otherwise generally unnecessary for a truly isotropic etching process. It is understood that impact zone 34 on wafer 30 as depicted in FIG. 7 is continuously changing as wafer 30 rotates. In some embodiments, nozzle 20 is designed and located so that etching liquid spray 32 impinges rotating wafer 30 slightly offset from center 31. In some embodiments, nozzle 20 is designed and located so that etching liquid spray 32 impinges rotating wafer 30 at an angle of incidence to wafer 30 less than 90°. For example, in some embodiments, substantially rectangular impact zone 34 is located in range of about from 1 mm to 20 mm radially outwards from center 31 and liquid spray 32 impinges wafer 30 at an angle of about from 60° to 89°, preferably in a range of about from 75° to 85°. As a result, etching liquid impinges wafer 30 and is sufficiently scattered, or with the appropriate angle of incidence, has a sufficient momentum component in the horizontal direction to cause the etching liquid to move from impact zone 34 radially inward towards center 31, even though centripetal force generated by rotating wafer 30 tends to pull etching liquid radially outwards. This technique is utilized to avoid undesired extensive etching of metal in the immediate vicinity of center 31 that sometimes occurs when etching liquid is applied directly at center 31.

Application of etching liquid by nozzle 20 on or near a diameter chord (i.e., passing through center 31) of wafer 30 generally contributes strongly to metal etching in local etch region 42 proximate to wafer center 31. Without being bound to any particular theory, it is believed that a flow pattern 32 of etching liquid extending across wafer 30 at or proximate to center 31 creating a band-like impact zone having a finite width, as depicted in FIG. 7, enhances the etching rate of metal closer to center 31 relative to the etching rate of metal at locations radially farther outwards (e.g., proximate to peripheral edge 40) simply because etching liquid is impacting (e.g., showering) areas of the wafer surface near center 31 a greater percentage of the time than at radial positions closer to peripheral edge 40. The fractional dwell time, $T_D$, of a particular point on a wafer surface under a band-like spray pattern 34 during which the particular point is being impacted by etching liquid is approximated by the following equation:

$$T_D = 2 \, \mathrm{Arctan}(W/r)/\pi \quad (1)$$

In Equation (1), W is the radial width of the band (e.g., width 33 of impact zone 34 in FIG. 7, assuming the inside edge of the band is located at center 31), and r is the radial distance of the particular point from center 31. For points at a distance r less than W, the fractional dwell time is 50 percent; that is, the particular point on the rotating wafer is being showered with etching liquid 50 percent of the time. At wafer center 31, the fractional dwell time is 100 percent, assuming the edge of spray pattern 32 is on center 31. At wafer edge 40, when W=5 cm and r=150 cm, the fractional dwell time, $T_D$, is only about 20 percent of the time when the edge of spray pattern 32 is at or proximate to center 31. Without being bound to any particular theory, it is believed that the dwell time of a particular point on the surface of the wafer during localized etching in accordance with the invention is a significant factor influencing the cumulative etching rate at that particular point. When etching liquid is applied only by a center nozzle, that is, by a nozzle applying a band-like pattern of etching liquid cutting across the wafer at or near the center, the cumulative etching rate (based on the total etching time) at a region near the center of the wafer is significantly greater than the cumulative etching rate (based on total etching time) at a region near the peripheral edge. It is believed this phenomenon occurs at least partly because a region near the center of the wafer is being impacted with fresh etching liquid, as well as the surface fluids being well mixed (i.e., under condition of substantial flow convection) during a greater percentage of the total etching time than a region at the edge.

Nozzle 22 of system 12 generates a fan-shaped 3-D spray 52 having a finite width 53 that impacts wafer 30 in a band-like impact zone 54 that extends substantially straight across wafer surface 36 parallel to a wafer diameter. An exemplary width 53 of fan-shaped 3-D spray 52 and band-like impact zone 54 is in a range of about from 5 mm to 20 mm. As depicted in FIG. 7, the trajectory of fan-shaped liquid spray 52 includes a peripheral portion 58 that extends beyond the peripheral edge 40 of semiconductor wafer 30. Similarly, nozzle 24 of system 12 generates a fan-shaped 3-D spray 62 having a width 63 that impacts wafer 30 in a band-like impact zone 64 that extends substantially straight across wafer surface 36 parallel to a wafer diameter. As depicted in FIG. 7, the trajectory of fan-shaped liquid spray 62 includes a peripheral portion 68 that extends beyond the peripheral edge 40 of semiconductor wafer 30. An exemplary width 63 of fan-shaped 3-D spray 62 and band-like impact zone 64 is in a range of about from 5 mm to 20 mm. In the embodiment of system 12 depicted in FIG. 7, some of the etching liquid initially deposited by nozzle 20 in impact zone 34 contributes substantially to the cumulative etching rates in etch regions radially outwards from center etch region. Some of this fluid is transported to more radially outward regions on the wafer, and is then stirred and mixed with fresh fluid arriving later from the same nozzle and/or from one or more other nozzles. Nevertheless, application of etching liquid by nozzle 22 contributes to enhanced etching of metal in local etch region 70 in the middle radial area of wafer surface 36, while not contributing substantially to etching in radially inward areas (or etch regions). Similarly, application of etching liquid by nozzle 24 contributes to enhanced etching of metal in local etch region 72 in the outer radial area of wafer surface 36, while typically not contributing substantially to etching in etch regions located radially inward from local etch region 72. It is understood that the different cumulative etching rates in two or more different local etch regions may be influenced by flow patterns generated by two or more etch nozzles. In some embodiments, only one flow pattern is modulated to influence and to control cumulative etching rates. In some embodiments, two or more flow patterns are modulated either simultaneously or sequentially during a total etching time to control cumulative etching rates in two or more local etch regions.

Each of local etch regions 42, 70, 72 is described and conceptualized herein as having a substantially definite area in which a substantially uniform cumulative local etching rate is achieved at the end of the total etching time. In reality, the boundaries of local etch regions in accordance with the invention are not always sharply defined, and the instantaneous etch rate at any given moment and the cumulative etch rate in a local etch region are not perfectly uniform across the region. Nevertheless, by modulating flow of etching liquid through one or more of the plurality of etch nozzles during an etching process, etching of metal from a substrate having a given initial thickness profile is tailored to achieve a desired end profile. In principle, as the number of etch nozzles is increased in a system such as system 12, the boundaries between local etch regions become more discrete and the uniformity of flow dwell time, etchant concentration and cumulative etching rate within each local etch region increases.

It has been determined that the flow pattern of etching liquid (or other liquid) applied using an etch nozzle to an impact zone at the surface of the semiconductor wafer generally influences to a greater or lesser degree the instantaneous etching rate, and thereby the cumulative etching rate, in a plurality of local etch regions. Numerous variables influence a flow pattern of liquid from an etch nozzle, including: etching liquid composition; liquid spray pattern out of a nozzle; location of the etch nozzle relative to a wafer; location of liquid impact zone on the wafer surface; angle of incidence of the etching liquid at the wafer surface; flow rate of etching liquid out of a nozzle; and rotational speed of the wafer. A feature of embodiments in accordance with the invention is that local etching of metal in a plurality of local etch regions is controlled to achieve fine-tuning of metal etching across the entire surface of a semiconductor wafer. It is believed that one or more nozzles, in addition to a center nozzle, applying a spray pattern of etching liquid to impact zones radially outwards from the center of a wafer, between the center and the edge of a wafer, increases the total dwell time of local regions under a high impact zone away from the center without increasing the dwell time in center regions. It is also believed that one or more additional spray patterns of etching liquid in high fluid flow impact zones radially outwards from the center serve to agitate etching liquid in outer regions, and to replenish and to refresh the etching liquid in outer regions of the wafer, thereby enhancing the etching rate for the period of time that the fluid is under the high impact flow, as well for some time thereafter. By modulating the flow pattern of etching liquid through center nozzle 20 during etching operations (e.g., by stopping flow of etching liquid through center nozzle 20 for a portion of the total etching time), while maintaining the flow patterns of etching liquid through other nozzles 22, 24, it is possible in some embodiments to modulate (e.g., decrease) the instantaneous and cumulative (i.e. time integrated average) etching rate of metal in center local etch region 42 relative to the instantaneous and cumulative etching rates in other regions of the wafer. Similarly, by modulating the flow pattern of etching liquid through edge nozzle 24 during etching operations (e.g., by increasing the flow rate or concentration of etching liquid through edge nozzle 24 for a portion of the total etching time), while maintaining the flow patterns of etching liquid through other nozzles 20, 22, it is possible in some embodiments to modulate (e.g., increase) the cumulative etching rate of metal in edge local etch region 72 relative to the cumulative etching rates in center and middle local etch regions 42, 70 of the wafer.

As depicted in FIG. 7, impact zones 34, 54, 64 are separate, non-intersecting zones. In some embodiments (not depicted), two or more distinct impact zones may overlap; that is, the flow patterns may intersect and/or the impact zones formed by etching liquid impacting the wafer may overlap, but not substantially enough to interfere with the capacity to modulate one or more flow patterns and, thereby, to control different cumulative etching rates in different local etch regions.

In preferred embodiments, nozzle arm 26 is movable in a direction perpendicular to the surface of semiconductor wafer 30, that is, in a vertical direction when semiconductor wafer 30 is oriented horizontally. In preferred embodiments, each of nozzles 20, 22, 24 is designed and selected to produce a desired liquid flow pattern, for example, a desired spray pattern. As depicted in FIG. 7, each of nozzles 20, 22, 24 produce a 3-D fan-shaped flow pattern of etching liquid that impacts wafer 30 to produce a substantially rectangular band across the wafer surface. In some embodiments, one or more of the plurality of nozzles produces a flow pattern different from the flow patterns depicted in FIG. 7; for example, an arc-shaped flow pattern that impacts a semiconductor wafer to form an arc-shaped band-like impact zone, or a band similar to that shown in FIG. 7, but with half the extent (i.e., passing though the wafer center but not extending completely across the wafer). In some embodiments, nozzle arm 26 is movable to a "fully retracted" position in which nozzle arm 26 and etch nozzles 20, 22, 24 are not directly above semiconductor wafer 30.

FIG. 8 depicts a view 300 of an apparatus 302 in accordance with the invention suitable for etching metal from a semiconductor wafer and thereafter rinsing etching liquid from the wafer and drying the wafer. Apparatus 302 includes treatment container 304 having a lower etch chamber 306 and an upper rinse chamber 308. Apparatus 302 further includes a horizontal splash shield 310 located between lower etch chamber 306 and upper rinse chamber 308. Apparatus 302 includes wafer holder assembly 312, which comprises adjustable shaft 314, wafer support arms 316 and wafer support nubs (not shown). Wafer holder assembly 312 is operable to hold a semiconductor wafer 320 having peripheral wafer edge 321 and a top wafer surface 322. During etching operations in accordance with the invention, wafer holder assembly 312 is operable to rotate a semiconductor wafer 320. Apparatus 302 includes a plurality of etch nozzles 326 assembled on nozzle support arm 328. During etching operations as depicted in FIG. 8, apparatus 302 is operable to dispose etch nozzles 326 in an etching position in which etch nozzles 326 are substantially directly above wafer surface 322. As depicted in FIG. 8, during etching operations, each of etch nozzles 326 is operable to provide a 3-D spray pattern 330 that impinges wafer surface 322 in a band-like local impact zone, as explained above with reference to FIG. 7. Etch nozzles are operable to generate and to apply distinct patterns of etching liquid (or other liquid) to distinct band-like impact zones on a rotating semiconductor wafer 332 to control a cumulative etching rate (over a total etching time) in a first local etch region relative to the cumulative etching rate in at least a second local etch region. Typically, control of cumulative etching in one or more local etch regions is achieved by modulating the flow of etching liquid in at least one of the plurality of etch nozzles.

Flow of etching liquid through a particular etch nozzle is modulated using one or a combination of various techniques; for example, including but not limited to: stopping or starting the flow of etching liquid through the nozzle; stopping or starting the flow of another liquid through the nozzle (e.g., deionized water or etch quenchant); changing the flow rate of liquid through the nozzle; changing the angle of incidence of the spray pattern to the wafer; and changing the shape and/or dimensions of a liquid spray pattern and its corresponding impact zone. During etching of metal from semiconductor wafer 320 in accordance with the invention, horizontal rinse shield 310 serves to inhibit etching liquid in lower etch chamber 306 from splashing onto inside walls 332 of upper rinsing chamber 308. Nozzle support arm 328 is attached to vertical shaft 334. Apparatus 302 further includes rinsing nozzle 336 located in upper rinsing chamber 308.

In certain embodiments, a system controller 330 is employed to control process conditions during prior, during or after wet etching. The controller will typically include one or more memory devices and one or more processors. The processor may include a CPU or computer, analog and/or digital input/output connections, stepper motor controller boards, etc.

In certain embodiments, the controller controls all of the activities of the wet etching apparatus including, for example, preparation of the etching solution by in-line mixing, modulation of one or more parameters of the etching nozzles during etching, and operation of rinse nozzle, etch nozzles, and splash shields during etching and rinsing. The system controller executes system control software including sets of instructions for controlling one or more of: the timing of etchant delivery, composition and concentration of etchant in each nozzle, nozzle position with respect to the wafer, timing of quenchant delivery and flow rate of quenchant from each nozzle, shape of flow pattern delivered from each nozzle, flow rate of etchant from each nozzle, and other parameters of a particular process. In some embodiments, the controller includes program instructions for controlling any of mentioned nozzle parameter during the time of etching. In other embodiments, the controller further controls each of these parameters with respect to an individual nozzle. For example, the controller may comprise instructions for how long each etching nozzle should be "on" during a particular process, at which time a diluent or a quenchant is added to a particular nozzle, at which angle of incidence the spray of etchant should be delivered onto the wafer, etc. Other computer programs stored on memory devices associated with the controller may be employed in some embodiments.

Typically there will be a user interface associated with controller 611. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, etchant composition and etchant flow rates, concentrations of etchant components, concentration of quenchant, and timing of delivery of etchant, quenchant or diluent. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive processes. Examples of programs or sections of programs for this purpose include etchant mixing control code, nozzle position control code, etchant delivery control code, and splash shield operation control code. For example, the etchant mixing control code can include instructions for combining two or more solutions within the lines of the etching apparatus in order to obtain the wet etchant shortly before it is delivered onto the substrate (e.g., within about 10 minutes after the etchant is prepared, such as within about 1 minute after the etchant is prepared, and even within about 15 seconds after the etchant is prepared). For example, the controller may include instructions for combining a solution comprising a complexing agent (including several complexing agents) and, optionally a pH adjustor with a solution comprising an oxidizer (e.g., hydrogen peroxide), and optionally with a diluent (e.g., water). The etchant splash shield operation code may include instructions for positioning a retractable vertical splash shield in an active position while applying a wet etching solution onto the semiconductor substrate so that the vertical splash shield substantially surrounds the semiconductor substrate in the substrate holder and is located between the wafer holder and the inner wall of the substrate treatment container and is operable to inhibit etching liquid from etch nozzles and from a spinning semiconductor substrate wafer from splashing onto the inner wall. The instructions of the etchant splash shield operation code may further include instructions for positioning the vertical splash shield in an inactive position during rinsing of the semiconductor substrate so that the vertical rinse shield is not proximate to the semiconductor wafer in the wafer holder. In addition the controller may include program instructions for performing any of the operations associated with wet etching described herein (e.g., wet etching, lowering rotation substrate rotation rate to remove copper from peripheral portion of the substrate backside, delivering a frontside cleaning liquid onto the substrate, rinsing and drying), as well as for the processes, such as nozzle modulation processes, in-line mixing processes, and splash shield operation processes described in U.S. Pat. No. 8,530,359 issued on Sep. 10, 2013, previously incorporated by reference.

EXPERIMENTAL

Glycine/$H_2O_2$ Etching

Figure 9A:
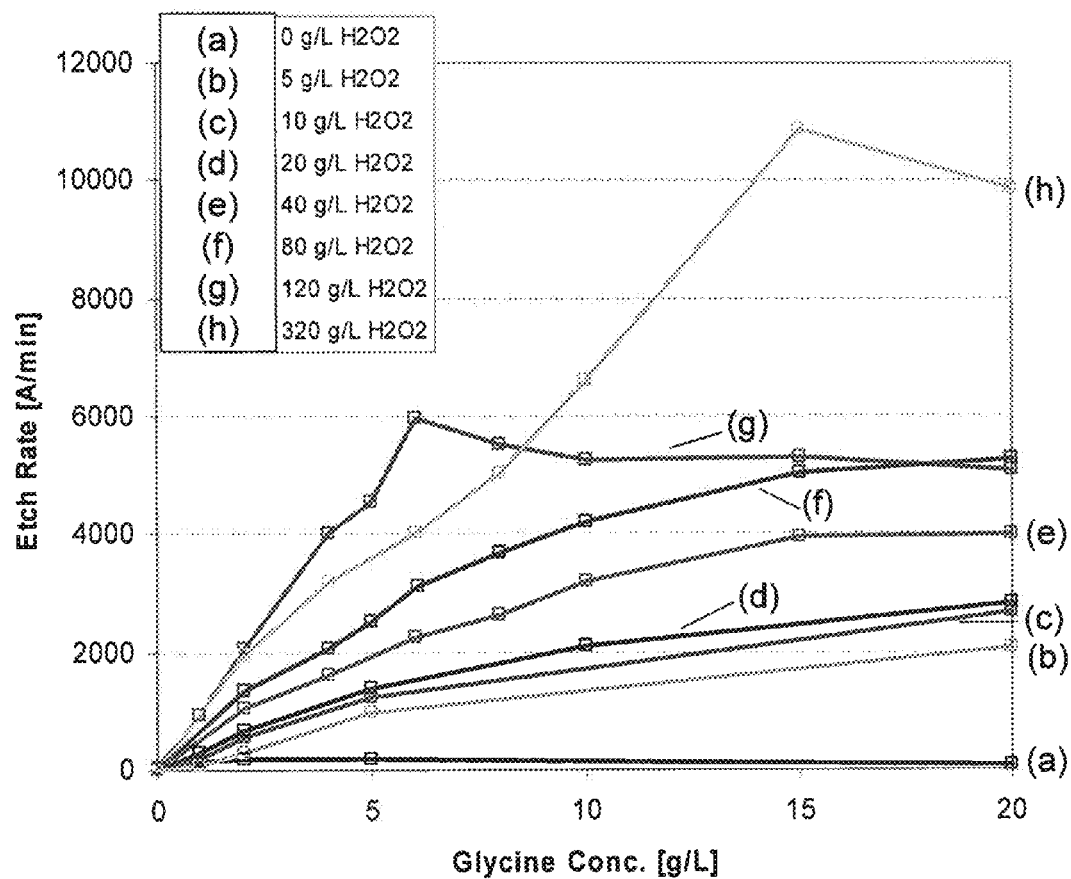
FIG. 9A is an experimental plot illustrating dependence of copper etch rate on glycine concentration at different concentrations of hydrogen peroxide.
Figure 9B:
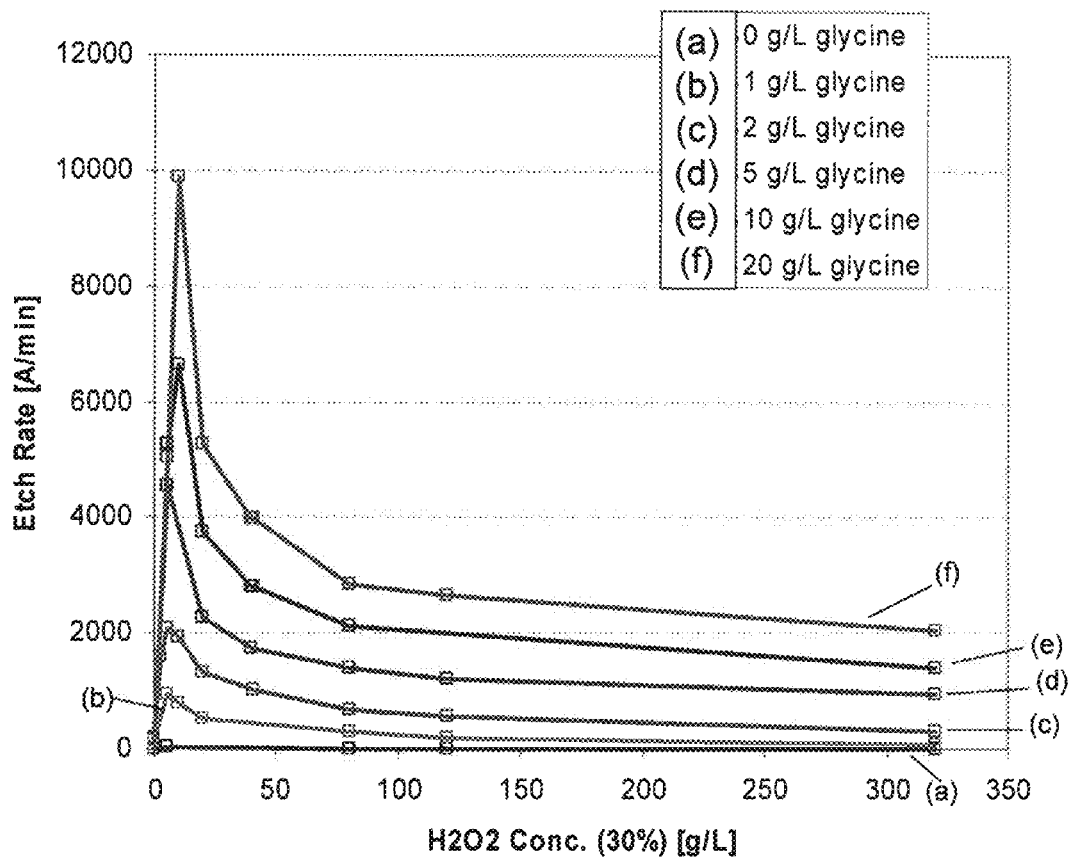
FIG. 9B is an experimental plot illustrating dependence of copper etch rate on hydrogen peroxide concentration at different concentrations of glycine.

A blanket coated copper film layer was first deposited and then was etched using a wet etching composition containing glycine and $H_2O_2$. Dependence of etch rates on the concentrations of glycine and $H_2O_2$ was investigated. FIG. 9A is a plot illustrating etch rate dependence on glycine concentrations at various concentrations of $H_2O_2$. Glycine concentration was varied from about 0 g/L to about 20 g/L. $H_2O_2$ concentration was varied from about 0 g/L to about 320 g/L. It can be seen that even at glycine concentration of 5 g/L, etch rates of greater than 1,000 Å were achieved. The peak etch rates of about 6,000 Å/minute (curve (g)) and about 11,000 Å/minute (curve (h)) were achieved at about 1:2 $H_2O_2$/glycine molar ratio.

FIG. 9A is a plot illustrating etch rate dependence on $H_2O_2$ concentrations at various concentrations of glycine. Peak etch rates were achieved at about 1:2 $H_2O_2$/glycine molar ratio.

Figure 9C:
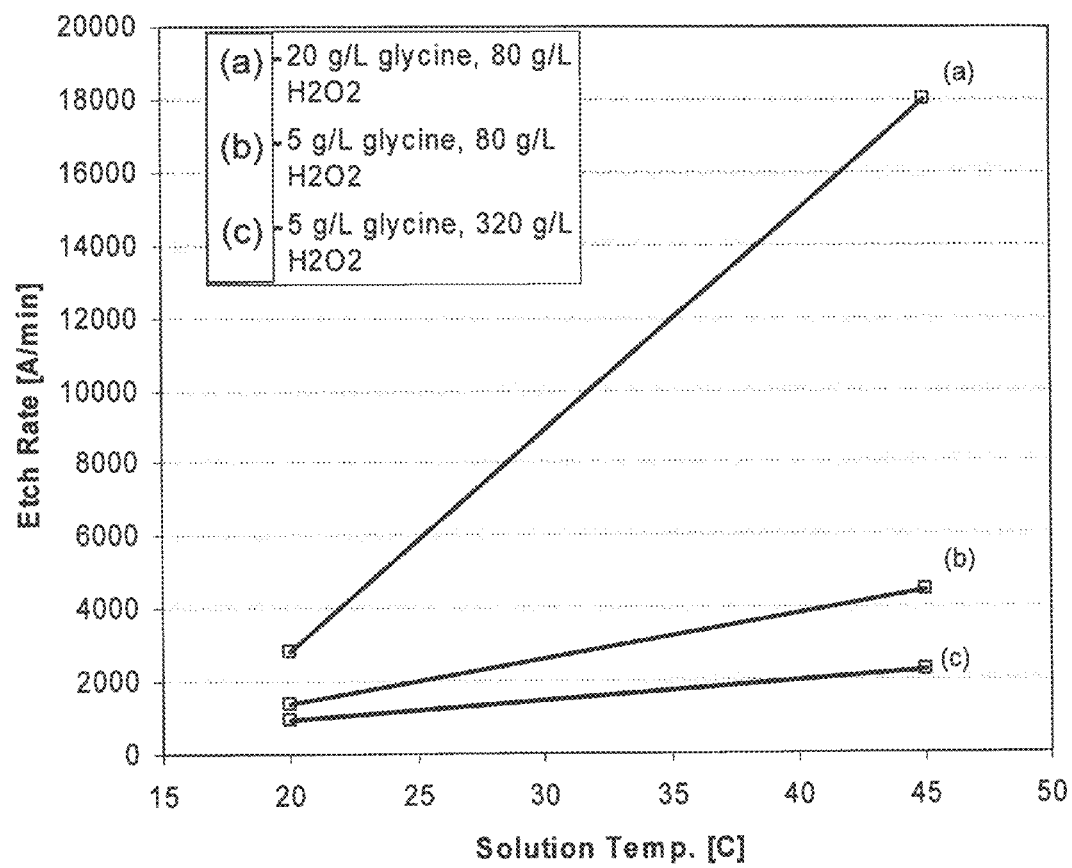
FIG. 9C is an experimental plot illustrating dependence of copper etch rate on temperature for etching compositions containing glycine and hydrogen peroxide.

FIG. 9C is a plot illustrating dependence of copper etch rate on solution temperature for three different etching compositions containing $H_2O_2$ and glycine. Etch rates at 20° C. and at 45° C. were measured. Etch rates increase as the solution temperature is raised. For example, in curve (a) etch rate is increased from about 2,500 Å/minute to about 18,000 Å/minute; in curve (b) etch rate is increased from about 1,000 Å/minute to about 4,000 Å/minute; and in curve (c) the etch rate is increased from about 1,000 Å/minute to about 2,000 Å/minute. The best reflectivity values were observed for (b) and (c).

Figure 9D:
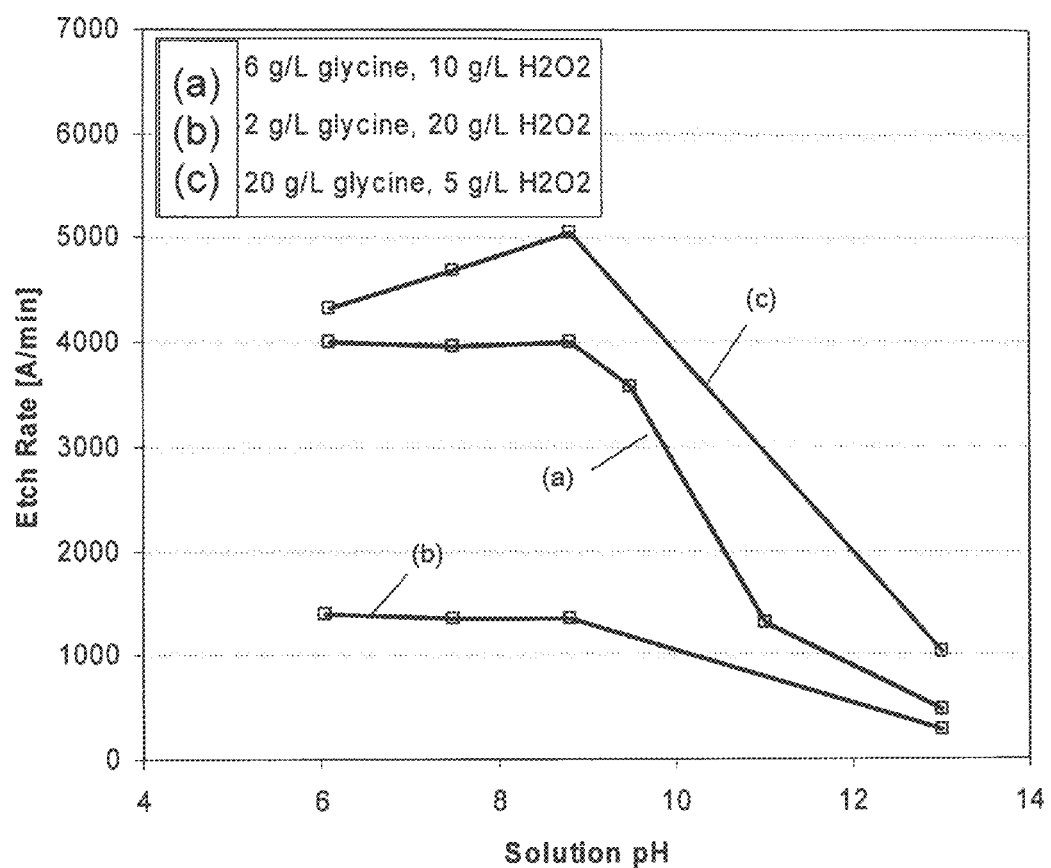
FIG. 9D is an experimental plot illustrating dependence of copper etch rate on pH of etching solution for etching compositions containing glycine and hydrogen peroxide.

FIG. 9D is a plot illustrating dependence of copper etch rate on solution pH for three different etching compositions containing $H_2O_2$ and glycine. The etch rate is decreasing when the pH of solution is raised above the pKa of glycine (9.6).

Roughness of copper surface obtained after etching was measured for several etching conditions. Reflectivities of greater than 120% (measured at 480 nm, after 4,500 Å of copper was removed) were observed for an etching chemistry containing 5 g/L glycine and 320 g/L $H_2O_2$, wherein the etching solution temperature was 45° C. Reflectivities were generally lower for solutions containing lower $H_2O_2$/glycine ratios.

Aminoacid/$H_2O_2$ Etching

A number of aminoacids were tested as complexing agents in etching compositions containing an aminoacid and hydrogen peroxide. In addition to glycine, appreciable etching rates were exhibited by DL-alanine, β-alanine, DL-valine, serine, and DL-methionine. Leucine, glutamine, aspartic acid, tyrosine, cystine, anthranilic acid, sarcosine, 3-aminobenzoic acid and 4-aminobenzoic acid exhibited significantly lower etch rates.

Figure 10:
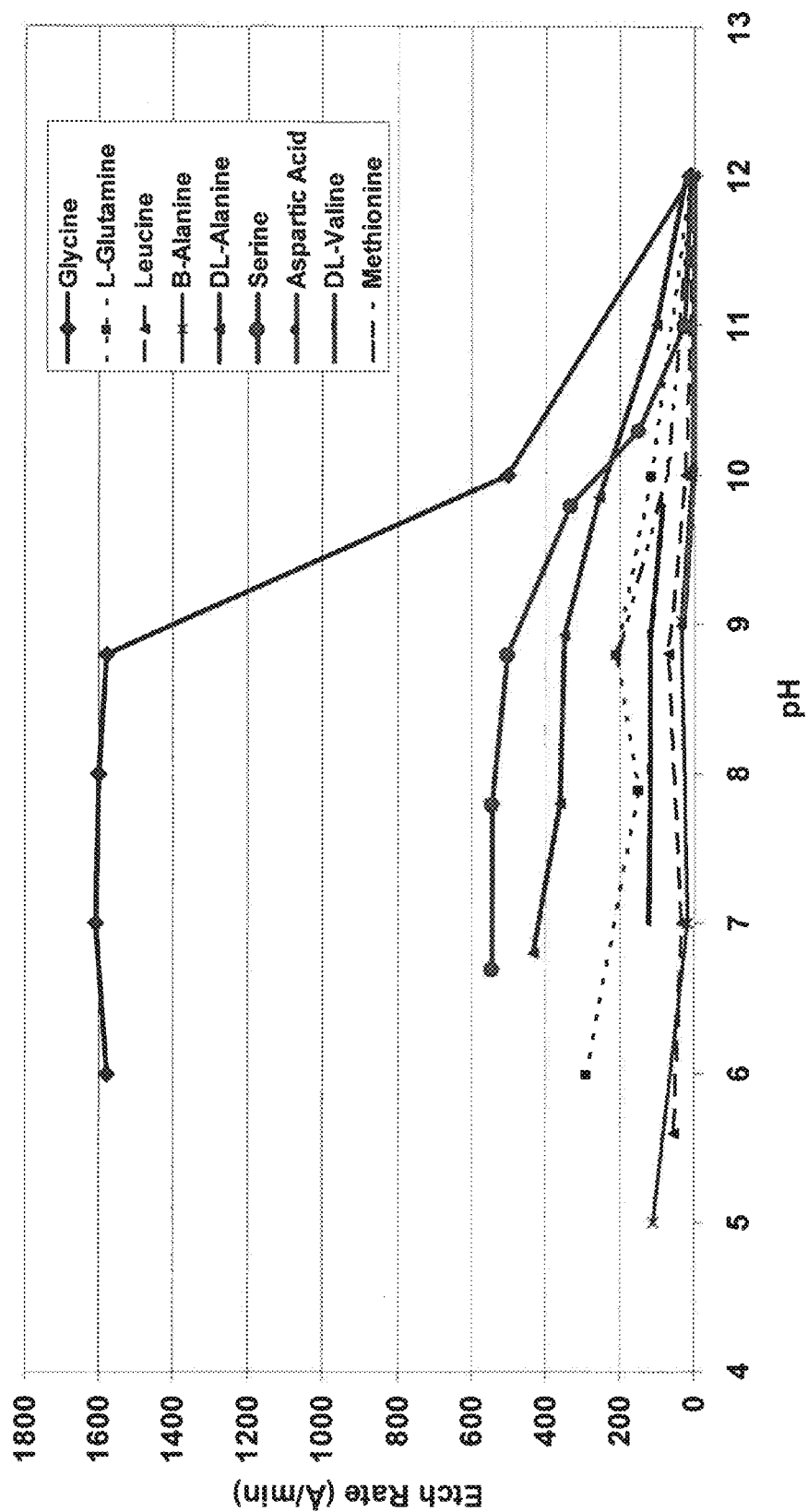
FIG. 10 is an experimental plot illustrating dependence of copper etch rate on pH for etching compositions containing different aminoacids and hydrogen peroxide.

FIG. 10 is a plot illustrating pH dependence of copper etch rates for a number of aminoacids. Glycine, L-gluthamine, leucine, β-alanine, DL-alanine, serine, aspartic acid, DL-valine, and methionine were tested. The concentrations of components in the etching solutions were identical: 1M $H_2O_2$ and 0.066 M aminoacid.

A Comparison of Ligands in Copper Etching

The following solutions were tested for their ability to etch copper isotropically:

(a) Ethylenediamine (0.066M), $H_2O_2$ (1.06 M), pH 8.9, 20° C.

This solution exhibits a relatively high etch rate of 4600 Å/min (e.g. compared to the amino acids described above), and also exhibited excellent isotropic behavior. Reflectivity of copper surface was 131% after etching (134% prior to etching) per 6900 Å removed.

(b) Glycine (0.066M), $H_2O_2$ (1.06 M), pH 8.9, 20° C.

This solution exhibits an etch rate of 1580 Å/min and isotropic behavior. Reflectivity of copper surface was 140% after etching (134% prior to etching) per 1053 Å removed. In this example we note that the reflectivity, indicative of the surfaces micro-smoothness, increased following the etching.

(c) Ammonium persulfate (0.066M), no hydrogen peroxide, pH 2.6, 20° C.

This low pH (acidic) etching solution exhibits an etch rate of 1849 Å/min, however copper surface with high roughness was obtained after etching. Reflectivity of copper surface was only 61% after etching (134% prior to etching) per 1849 Å removed. A matte finish was observed.

(d) Ammonium acetate (0.066M), $H_2O_2$ (1.06 M), pH 3.6, 20° C.

This low pH etching solution exhibits an etch rate of 1163 Å/min, however a red/brown copper oxide surface film was obtained during and after etching. Reflectivity of copper surface was only 8.8% after etching (134% prior to etching) per 1163 Å removed.

(e) Ammonium persulfate (0.066M), no hydrogen peroxide, pH 8.9, 20° C.

This etching solution exhibits an etch rate of only 613 Å/min, however copper surface with red/brown oxide was obtained after etching. Reflectivity of copper surface was 52% after etching (134% prior to etching) per 429 Å removed.

(f) Ammonium hydroxide (0.066M), $H_2O_2$ (1.06 M), pH 8.9, 20° C.

This etching solution exhibits an etch rate of only 53 Å/min, however copper surface with red/brown oxide was obtained after etching. Reflectivity of copper surface was 68% after etching (134% prior to etching) per 53 Å removed.

(g) EDTA (0.066M), $H_2O_2$ (1.06 M), pH 8.9, 20° C.

This etching solution exhibits an etch rate of only 5 Å/min. Reflectivity of copper surface was 135% after etching (134% prior to etching) per 5 Å removed, indicating very little interaction with the surface (i.e. little metal removal or film formation).

(h) Citric acid (0.066M), $H_2O_2$ (1.06 M), pH 8.9, 20° C.

This etching solution also exhibits no appreciable etching at all.

(i) Oxalic acid (0.066M), $H_2O_2$ (1.06 M), pH 8.9, 20° C.

This etching solution also exhibits no appreciable etching at all.

(j) Ammonium acetate (0.066M), $H_2O_2$ (1.06 M), pH 9.6, 20° C.

This etching solution exhibits an etch rate of 429 Å/min, however copper surface with red/brown oxide was obtained after etching. Reflectivity of copper surface was 13% after etching (134% prior to etching) per 429 Å removed.

Figure 11:
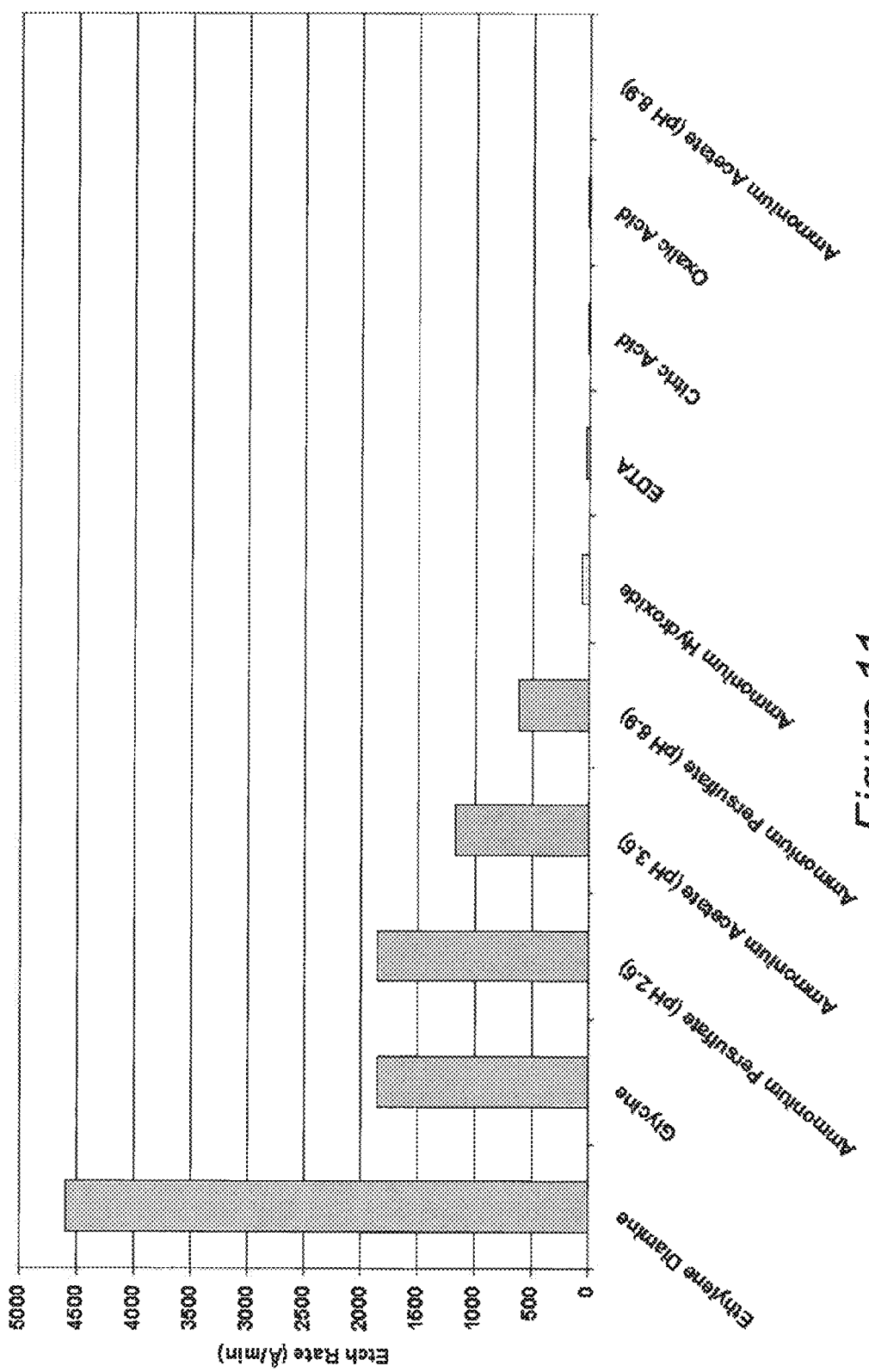
FIG. 11 is an experimental bar graph showing copper etch rates for different chemistries.

A bar graph illustrating dependence of etch rates on etching chemistry is shown in FIG. 11.

It can be seen that of the examples given, only EDA and glycine provide both high etching rates and isotropic behavior. Ammonium hydroxide and ammonium salts lead to formation of oxide deposits on copper surface and/or to high surface roughness. EDTA, citric and oxalic acids do not exhibit appreciable etch rates.

Etching Solutions Containing EDA and $H_2O_2$

Figure 12:
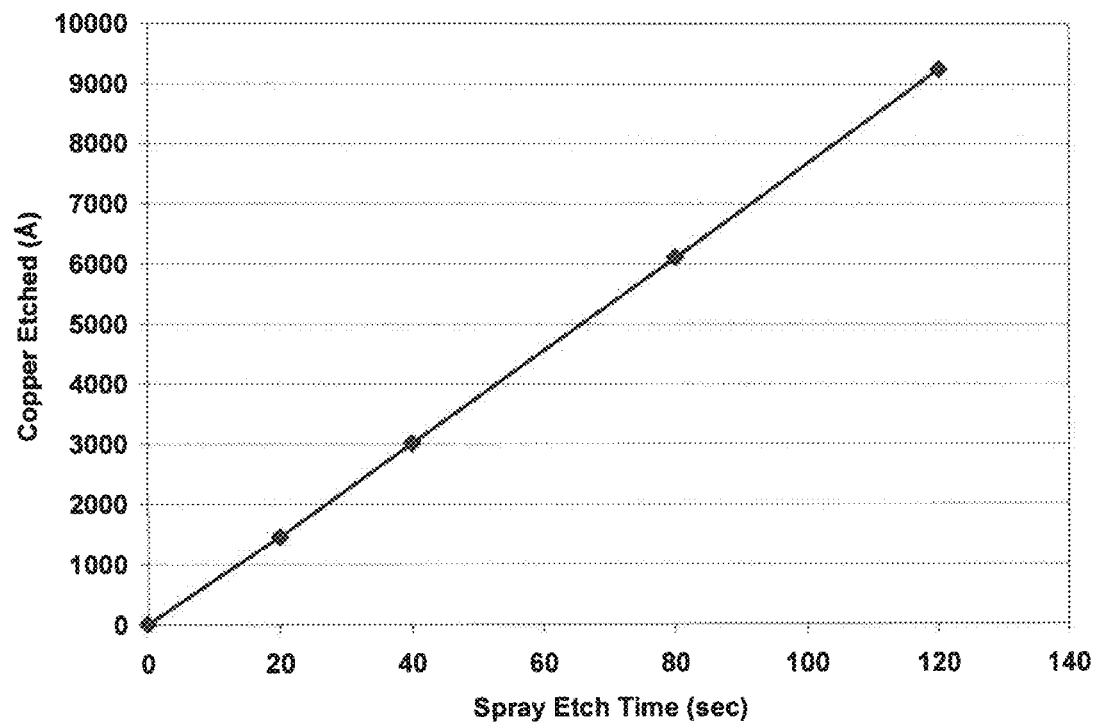
FIG. 12 is an experimental plot illustrating dependence of the amount of etched copper on the spray etch time for an etching solution containing EDA and hydrogen peroxide.
Figure 13:
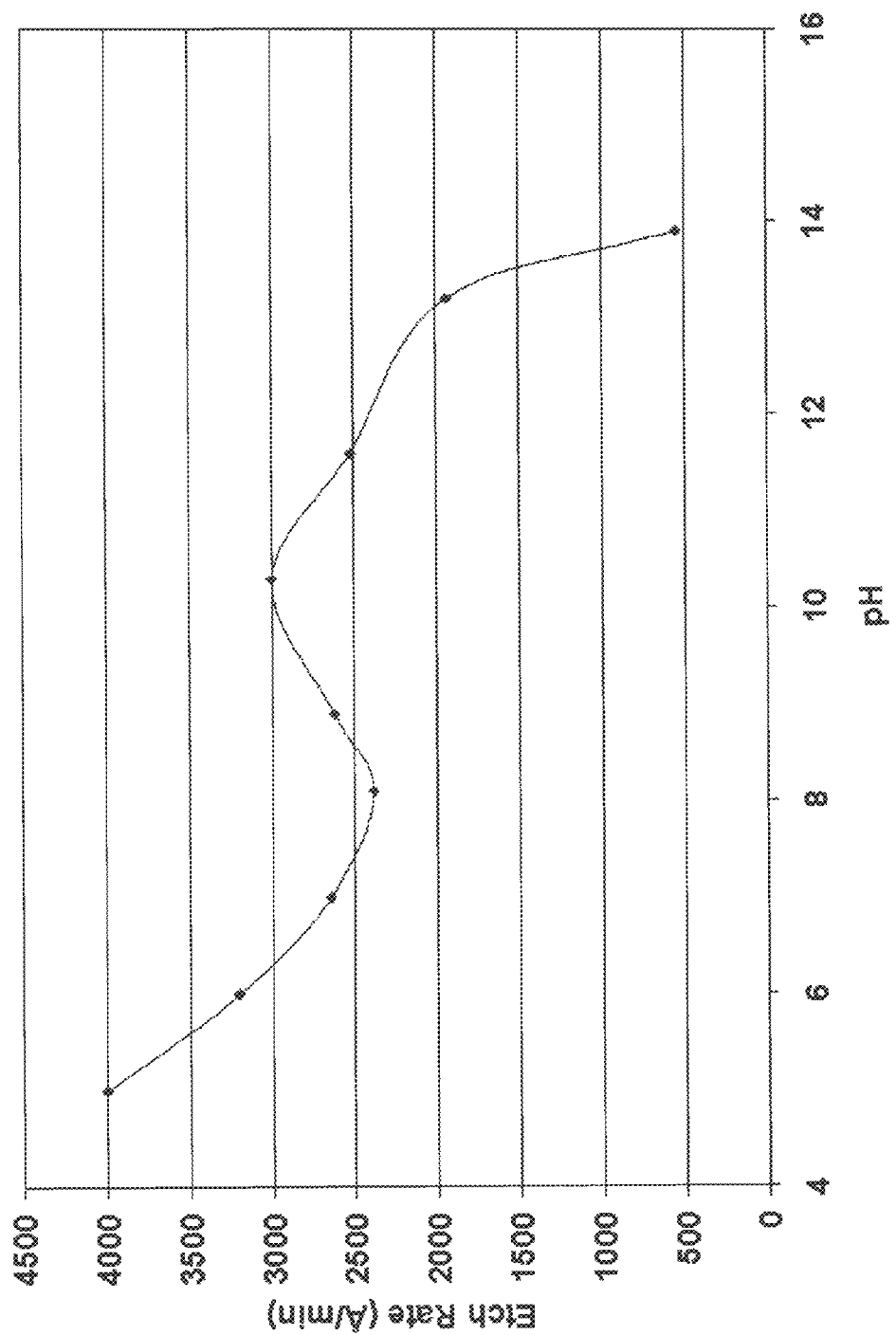
FIG. 13 is an experimental plot illustrating pH dependence of the copper etch rate for an etching solution containing EDA and hydrogen peroxide.

A copper film was etched by spraying an etching solution containing EDA (4 g/L, 0.067 M), and $H_2O_2$ (120 g/L of 30% $H_2O_2$, or about 1.9 M) onto the substrate. The pH of solution was 8.9; the temperature was 20° C. Etch rate of about 4,600 Å/minute was observed. After 7,000 Å of copper were removed, the reflectivity was 122% (compared to 125% reflectivity prior to etching). FIG. 12 illustrates a dependence of the amount of etched copper on the spray etch time. It can be seen that about 9,000 Å were removed in about 120 seconds. The amount of etched copper linearly depends on the spray etch time.

In another experiment pH dependence of copper etch rate was studied. An etching solution containing 2 g/L (0.033 M) EDA and 30 g/L of 30% $H_2O_2$ (9 g/L, or 0.47M) was used. pH was adjusted with $H_2SO_4$ or TMAH depending on the need to increase of decrease the pH from the un-modified EDA/peroxide mixture value. It was observed that at pH values lower than 7, copper surface became rough and had a matte surface reflection, and had streaks or swirls, and was generally non-uniform in appearance. At high pH (above 11) the etch rates declined though the surface appear relatively unaltered (reflective/smooth). It was found that the preferred pH for EDA etch was from about 7 to about 10.5, more typically from about 8.5 to 10.

Figure 14:
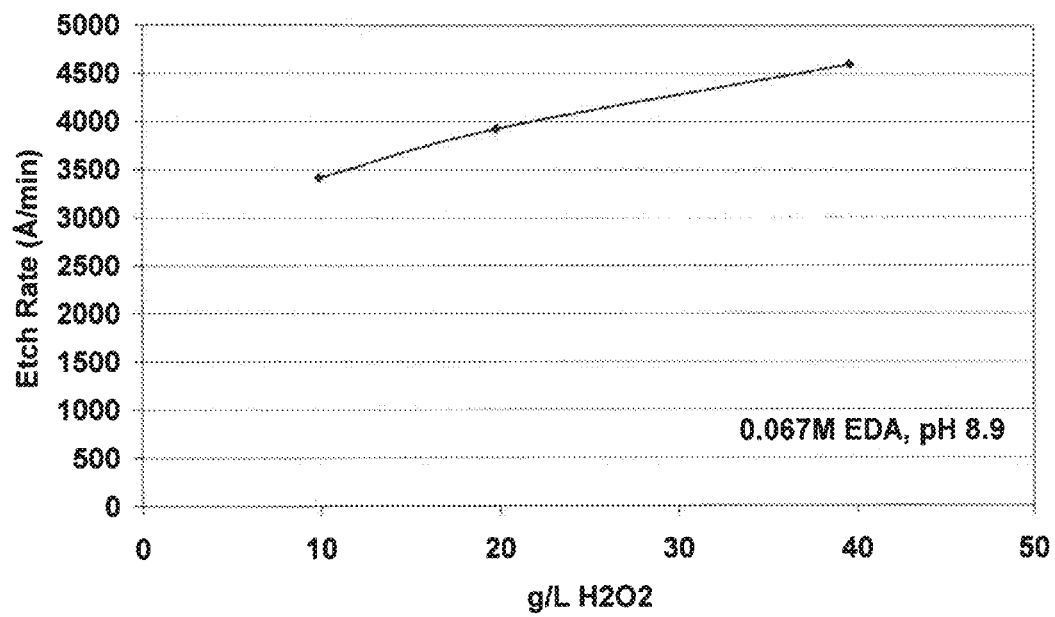
FIG. 14 is an experimental plot illustrating dependence of the copper etch rate on hydrogen peroxide concentration for an etching solution containing EDA and hydrogen peroxide.

FIG. 14 illustrates etch rate dependence on the concentration of $H_2O_2$ for a solution containing EDA (0.067M) and $H_2O_2$ (10-40 g/L) at a fixed pH of 8.9. The etch rate is moderately increasing as the amount of $H_2O_2$ is increased.

Figure 15:
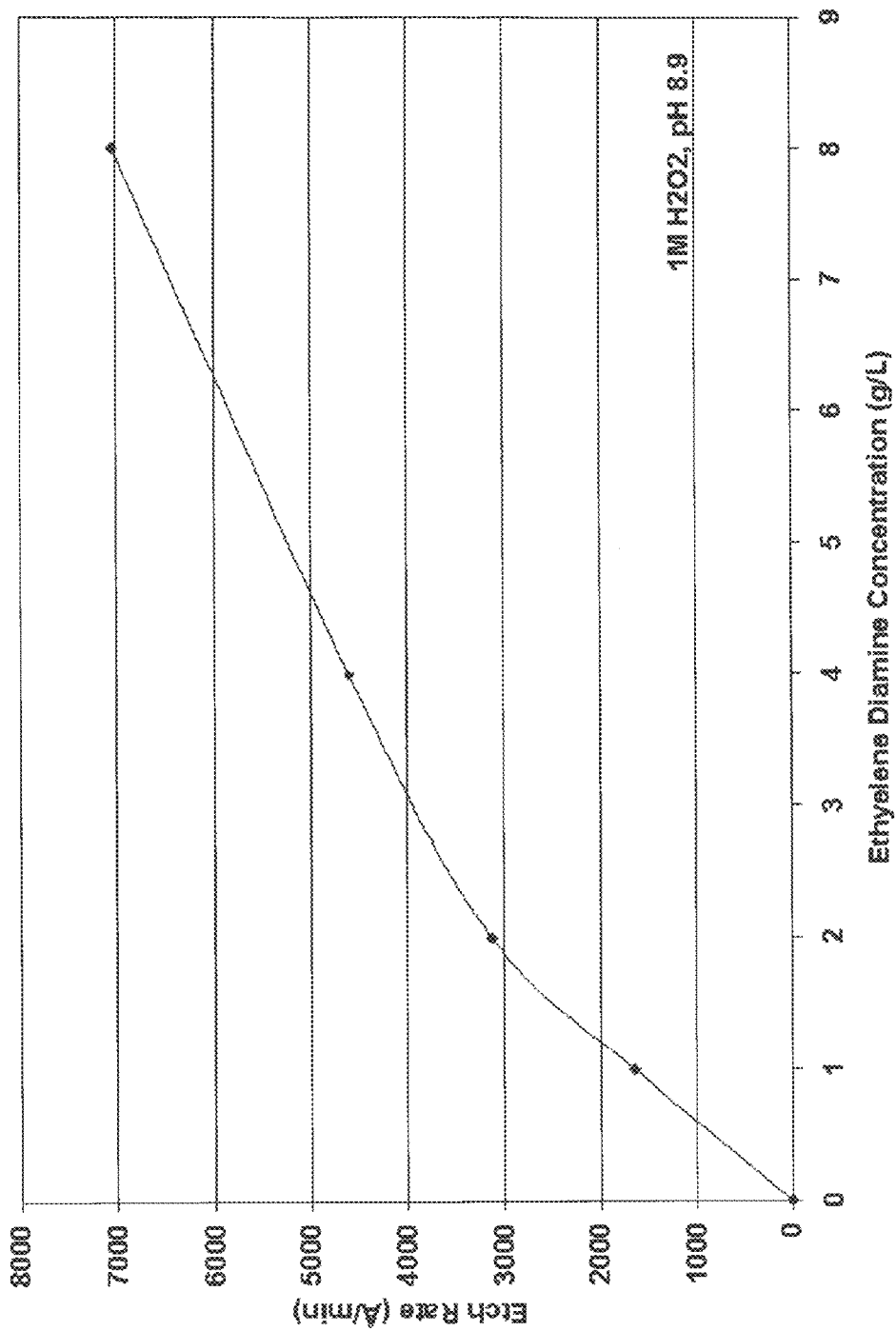
FIG. 15 is an experimental plot illustrating dependence of the copper etch rate on EDA concentration for an etching solution containing EDA and hydrogen peroxide.

FIG. 15 illustrates etch rate dependence on the concentration of EDA for a solution containing EDA (0-8 g/L) and $H_2O_2$ (1 M) at pH 8.9. It can be seen that etch rate is strongly dependent on the concentration of EDA. The rate of etching increase in a near linear fashion for concentration greater than 8 g/L, for example, at a rate of about 2.2 um/min at a concentration of 32 g/L (data not shown in FIG. 15).

Table 4 illustrates changes in reflectivity (per 1000 Å of copper etched) for different compositions of an etching solution containing EDA and hydrogen peroxide.

TABLE 4

Copper surface roughness obtained after etching with different solutions comprising EDA.

| EDA Concentration (g/L) | H2O2 Concentration (g/L) | pH | % Change Reflectance/(1000 Å) |
| --- | --- | --- | --- |
| 1 | 39.6 | 8.9 | 11.1 |
| 2 | 9.9 | 7 | 5.4 |
| 2 | 9.9 | 8.1 | 3.9 |
| 2 | 9.9 | 8.9 | 2.8 |
| 2 | 9.9 | 10.3 | 14.4 |
| 2 | 9.9 | 11.6 | 14.2 |
| 4 | 9.9 | 8.9 | 1.4 |
| 4 | 19.8 | 8.9 | 0.67 |
| 4 | 39.6 | 8.9 | 0.34 |
| 8 | 39.6 | 8.9 | 2.8 |

Etching Solutions with Other Complexing Agents Containing an Aminogroup

A number of solutions containing different complexing agents were tested. pH was adjusted to 8.9 or 8.8 with TMAH or $H_2SO_4$.

(a) N-methylethylenediamine (0.066M), $H_2O_2$ (1.00 M), pH 8.9, 20° C.

This solution exhibits an appreciable etch rate of 1575 Å/min and isotropic behavior. Reflectivity of copper surface was 127% after etching (134% prior to etching) per 1575 Å removed.

(b) Sarcosine (0.066M), $H_2O_2$ (1.00 M), pH 8.9, 20° C.
This solution exhibits an etch rate of 11.5 Å/min.

(c) Taurine (0.066M), $H_2O_2$ (1.00 M), pH 8.9, 20° C.
This solution exhibits an etch rate of 12 Å/min.

(d) Ethanolamine (0.066M), $H_2O_2$ (1.00 M), pH 8.9, 20° C.
This solution does not exhibit appreciable etching.

(e) Diethylenetriamine (0.067 M), $H_2O_2$ (1.16 M), pH 8.8, 20° C.

This solution exhibits high etch rate of 4395 Å/min and isotropic behavior. Reflectance increase of 4.0% per 1,000 Å removed was observed.

Non-uniformity of 8.85% was observed.

(f) Triethylenetetramine (0.067 M), $H_2O_2$ (1.16 M), pH 8.8, 20° C.

This solution exhibits high etch rate of 1705 Å/min and isotropic behavior. Reflectance increase of 8.9% per 1,000 Å removed was observed.

Non-uniformity of 2.65% was observed.

(g) Tris(2-aminoethyl)amine (0.067 M), $H_2O_2$ (1.16 M), pH 8.8, 20° C.

This solution exhibits an appreciable etch rate of 1,000 Å/min and isotropic behavior. Reflectance increase of 7.6% per 1,000 Å removed was observed.

Non-uniformity of 3.10% was observed.

(h) Polyethyleneimine (4 g/L), $H_2O_2$ (1.16 M), pH 8.8, 20° C.

This solution exhibits an etch rate of 33.5 Å/min. Reflectance increase of 4.1% per 67 Å removed was observed.

Non-uniformity of 42% was observed.

The invention claimed is:

1. A concentrated solution for preparing a wet etching solution for copper etching, the concentrated solution consisting essentially of:
   (a) water;
   (b) one or more polyamines selected from the group consisting of a bidentate diamine, a tridentate triamine and a quadridentate tetramine, wherein the concentration of aminogroups derived from these polyamines is at least about 1.5 M; and
   (c) one or more pH adjustors selected from the group consisting of sulfuric acid, an alkylsulphonic acid, a carboxylic acid, and an aminoacid, wherein the concentrated solution has a pH of between about 8.5 and 11.5 at 21° C.

2. The concentrated solution of claim 1, wherein the concentrated solution has a pH of between about 9 and 11.5 at 21° C.

3. The concentrated solution of claim 1, wherein the concentration of aminogroups derived from the polyamines is at least about 3 M.

4. The concentrated solution of claim 1, wherein the concentration of aminogroups derived from the polyamines is at least about 4 M.

5. The concentrated solution of claim 1, wherein the concentrated solution comprises a single polyamine, wherein the single polyamine is ethylenediamine.

6. The concentrated solution of claim 1, wherein the concentrated solution comprises a single polyamine, wherein the single polyamine is ethylenediamine, and wherein the pH adjustor comprises glycine.

7. The concentrated solution of claim 1, wherein the concentrated solution comprises a single polyamine, wherein the single polyamine is ethylenediamine, and wherein the pH adjustor comprises sulfuric acid.

8. The concentrated solution of claim 1, wherein the concentrated solution comprises a single polyamine, wherein the single polyamine is ethylenediamine, and wherein the pH adjustor comprises acetic acid.

9. The concentrated solution of claim 1, wherein the concentrated solution comprises a single polyamine, wherein the single polyamine is ethylenediamine, and wherein the pH adjustor comprises methanesulfonic acid.

10. The concentrated solution of claim 1, wherein the concentrated solution consists essentially of water, ethylenediamine, and sulfuric acid.

11. The concentrated solution of claim 1, wherein the concentrated solution consists essentially of water, ethylenediamine, and glycine.

12. The concentrated solution of claim 1, wherein the concentrated solution consists essentially of water, ethylenediamine, glycine, acetic acid and sulfuric acid.

13. The concentrated solution of claim 1, wherein the concentrated solution consists essentially of water, ethylenediamine, and acetic acid.

* * * * *